US010741458B2

(12) United States Patent
Kang et al.

(10) Patent No.: US 10,741,458 B2
(45) Date of Patent: *Aug. 11, 2020

(54) METHODS FOR DEPOSITING FILMS ON SENSITIVE SUBSTRATES

(71) Applicant: Novellus Systems, Inc., Fremont, CA (US)

(72) Inventors: Hu Kang, Tualatin, OR (US); Shankar Swaminathan, Beaverton, OR (US); Adrien LaVoie, Newberg, OR (US); Jon Henri, West Linn, OR (US)

(73) Assignee: Novellus Systems, Inc., Fremont, CA (US)

( * ) Notice: Subject to any disclaimer, the term of this patent is extended or adjusted under 35 U.S.C. 154(b) by 10 days.

This patent is subject to a terminal disclaimer.

(21) Appl. No.: 15/965,628

(22) Filed: Apr. 27, 2018

(65) Prior Publication Data

US 2018/0247875 A1    Aug. 30, 2018

Related U.S. Application Data

(60) Continuation of application No. 15/650,662, filed on Jul. 14, 2017, now Pat. No. 10,008,428, which is a
(Continued)

(51) Int. Cl.
    *H01L 21/66*    (2006.01)
    *H01L 21/02*    (2006.01)
    (Continued)

(52) U.S. Cl.
    CPC .......... *H01L 22/26* (2013.01); *C23C 16/345* (2013.01); *C23C 16/401* (2013.01);
    (Continued)

(58) Field of Classification Search
    CPC ............ H01L 22/26; H01L 21/0228; H01L 21/02219; H01L 22/20; H01L 22/12;
    (Continued)

(56) References Cited

U.S. PATENT DOCUMENTS 4,500,563 A    2/1985    Ellenberger et al.
5,094,984 A    3/1992    Liu et al.
               (Continued)

FOREIGN PATENT DOCUMENTS

CN    1732288 A    2/2006
CN    1841676 A    10/2006
               (Continued)

OTHER PUBLICATIONS

U.S. Office Action dated Mar. 15, 2013 issued in U.S. Appl. No. 13/084,399.
(Continued)

*Primary Examiner* — Thanhha S Pham
(74) *Attorney, Agent, or Firm* — Weaver Austin Villeneuve & Sampson LLP

(57) ABSTRACT

Methods and apparatus to form films on sensitive substrates while preventing damage to the sensitive substrate are provided herein. In certain embodiments, methods involve forming a bilayer film on a sensitive substrate that both protects the underlying substrate from damage and possesses desired electrical properties. Also provided are methods and apparatus for evaluating and optimizing the films, including methods to evaluate the amount of substrate damage resulting from a particular deposition process and methods to determine the minimum thickness of a protective layer. The methods and apparatus described herein may be used to deposit films on a variety of sensitive materials such as silicon, cobalt, germanium-antimony-tellurium, silicon-germanium, silicon nitride, silicon carbide, tungsten, titanium, tantalum, chromium, nickel, palladium, ruthenium, or silicon oxide.

16 Claims, 11 Drawing Sheets

Related U.S. Application Data division of application No. 15/015,952, filed on Feb. 4, 2016, now Pat. No. 9,786,570, which is a division of application No. 14/074,617, filed on Nov. 7, 2013, now Pat. No. 9,287,113.

(60) Provisional application No. 61/724,217, filed on Nov. 8, 2012.

(51) Int. Cl.
*C23C 16/34* (2006.01)
*C23C 16/40* (2006.01)
*C23C 16/455* (2006.01)

(52) U.S. Cl.
CPC .... *C23C 16/4554* (2013.01); *C23C 16/45542* (2013.01); *H01L 21/0217* (2013.01); *H01L 21/0228* (2013.01); *H01L 21/02164* (2013.01); *H01L 21/02219* (2013.01); *H01L 21/02274* (2013.01); *H01L 22/12* (2013.01); *H01L 22/20* (2013.01)

(58) Field of Classification Search
CPC ........... H01L 21/0217; H01L 21/02164; H01L 21/02274; C23C 16/45542; C23C 16/4554; C23C 16/401; C23C 16/345
See application file for complete search history.

(56) References Cited

U.S. PATENT DOCUMENTS

| | | |
|---|---|---|
| 5,223,443 A | 6/1993 | Chinn et al. |
| 5,318,928 A | 6/1994 | Gegenwart et al. |
| 5,496,608 A | 3/1996 | Matsuda et al. |
| 5,593,914 A | 1/1997 | Evans, Jr. et al. |
| 5,670,432 A | 9/1997 | Tsai |
| 5,856,003 A | 1/1999 | Chiu |
| 5,874,368 A | 2/1999 | Laxman et al. |
| 5,916,365 A | 6/1999 | Sherman |
| 5,932,286 A | 8/1999 | Beinglass et al. |
| 6,069,058 A | 5/2000 | Hong |
| 6,100,202 A | 8/2000 | Lin et al. |
| 6,156,149 A | 12/2000 | Cheung et al. |
| 6,218,293 B1 | 4/2001 | Kraus et al. |
| 6,270,572 B1 | 8/2001 | Kim et al. |
| 6,346,741 B1 | 2/2002 | Van Buskirk et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,482,726 B1 | 11/2002 | Aminpur et al. |
| 6,509,601 B1 | 1/2003 | Lee et al. |
| 6,528,430 B2 | 3/2003 | Kwan et al. |
| 6,551,893 B1 | 4/2003 | Zheng et al. |
| 6,569,501 B2 | 5/2003 | Chiang et al. |
| 6,576,053 B1 | 6/2003 | Kim et al. |
| 6,602,784 B2 | 8/2003 | Sneh |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic et al. |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,097,886 B2 | 8/2006 | Moghadam et al. |
| 7,109,129 B1 | 9/2006 | Papasouliotis |
| 7,115,166 B2 | 10/2006 | Vaartstra et al. |
| 7,115,528 B2 | 10/2006 | Vaartstra et al. |
| 7,122,222 B2 | 10/2006 | Xiao et al. |
| 7,122,464 B2 | 10/2006 | Vaarstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,235,484 B2 | 6/2007 | Nguyen et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,745,346 B2 | 6/2010 | Hausmann et al. |
| 7,758,920 B2 | 7/2010 | Hasebe et al. |
| 7,776,733 B2 | 8/2010 | Hasegawa |
| 7,790,633 B1 | 9/2010 | Tarafdar et al. |
| 7,825,039 B2 | 11/2010 | Takahashi et al. |
| 7,863,190 B1 | 1/2011 | Papasouliotis et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |

(56) References Cited

U.S. PATENT DOCUMENTS

| | | |
|---|---|---|
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,338,312 B2 | 12/2012 | Sato et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,846,484 B2 | 9/2014 | Lee et al. |
| 8,956,983 B2 | 2/2015 | Swaminathan et al. |
| 8,999,859 B2 | 4/2015 | Swaminathan et al. |
| 9,023,693 B1 | 5/2015 | Lin et al. |
| 9,076,646 B2 | 7/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,406,693 B1 | 8/2016 | Pang et al. |
| 9,502,238 B2 | 11/2016 | Danek et al. |
| 9,564,312 B2 | 2/2017 | Henri et al. |
| 9,570,274 B2 | 2/2017 | Swaminathan et al. |
| 9,570,290 B2 | 2/2017 | Swaminathan et al. |
| 9,611,544 B2 | 4/2017 | Lavoie et al. |
| 9,627,221 B1 | 4/2017 | Zaitsu et al. |
| 9,673,041 B2 | 6/2017 | Swaminathan et al. |
| 9,685,320 B2 | 6/2017 | Kang et al. |
| 9,786,570 B2 | 10/2017 | Kang et al. |
| 9,793,110 B2 | 10/2017 | Kang et al. |
| 9,875,891 B2 | 1/2018 | Henri et al. |
| 9,892,917 B2 | 2/2018 | Swaminathan et al. |
| 9,997,357 B2 | 6/2018 | Arghavani et al. |
| 10,008,428 B2 | 6/2018 | Kang et al. |
| 10,037,884 B2 | 7/2018 | Ou et al. |
| 10,043,655 B2 | 8/2018 | Swaminathan et al. |
| 10,043,657 B2 | 8/2018 | Swaminathan et al. |
| 10,062,563 B2 | 8/2018 | Kumar et al. |
| 10,269,559 B2 | 4/2019 | Abel et al. |
| 10,361,076 B2 | 7/2019 | Kang et al. |
| 10,373,806 B2 | 8/2019 | Singhal et al. |
| 10,559,468 B2 | 2/2020 | Arghavani et al. |
| 2002/0066411 A1 | 6/2002 | Chiang et al. |
| 2002/0076507 A1 | 6/2002 | Chiang et al. |
| 2002/0153101 A1 | 10/2002 | Nguyen et al. |
| 2002/0175393 A1 | 11/2002 | Baum et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0200917 A1 | 10/2003 | Vaartstra |
| 2003/0216006 A1 | 11/2003 | Li et al. |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0129212 A1 | 7/2004 | Gadgil et al. |
| 2004/0146644 A1 | 7/2004 | Xiao et al. |
| 2004/0157472 A1 | 8/2004 | Sugino et al. |
| 2004/0171280 A1 | 9/2004 | Conley, Jr. et al. |
| 2004/0219746 A1 | 11/2004 | Vaartstra et al. |
| 2004/0219784 A1 | 11/2004 | Kang et al. |
| 2004/0231799 A1 | 11/2004 | Lee et al. |
| 2005/0005851 A1 | 1/2005 | Keshner et al. |
| 2005/0009368 A1 | 1/2005 | Vaartsra |
| 2005/0042865 A1 | 2/2005 | Cabral et al. |
| 2005/0079661 A1 | 4/2005 | Cho et al. |
| 2005/0109276 A1 | 5/2005 | Iyer et al. |
| 2005/0118837 A1 | 6/2005 | Todd et al. |
| 2005/0142795 A1 | 6/2005 | Ahn et al. |
| 2005/0158983 A1 | 7/2005 | Hoshi et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0282346 A1 | 12/2005 | Barth et al. |
| 2005/0287775 A1 | 12/2005 | Hasebe et al. |
| 2006/0003557 A1 | 1/2006 | Cabral et al. |
| 2006/0009041 A1 | 1/2006 | Iyer et al. |
| 2006/0030148 A1 | 2/2006 | Seutter et al. |
| 2006/0032442 A1 | 2/2006 | Hasebe |
| 2006/0084283 A1 | 4/2006 | Paranjpe et al. |
| 2006/0088985 A1 | 4/2006 | Haverkort et al. |
| 2006/0105106 A1 | 5/2006 | Balseanu et al. |
| 2006/0165890 A1 | 7/2006 | Kaushal et al. |
| 2006/0183055 A1 | 8/2006 | O'Neill et al. |
| 2006/0199357 A1 | 9/2006 | Wan et al. |
| 2006/0216418 A1 | 9/2006 | Matsuura |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0026540 A1 | 2/2007 | Nooten et al. |
| 2007/0032047 A1 | 2/2007 | Hasebe et al. |
| 2007/0048455 A1 | 3/2007 | Koh et al. |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0116887 A1 | 5/2007 | Faguet |
| 2007/0119370 A1 | 5/2007 | Ma et al. |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0243693 A1 | 10/2007 | Nemani et al. |
| 2007/0245959 A1 | 10/2007 | Paterson et al. |
| 2007/0251444 A1 | 11/2007 | Gros-Jean et al. |
| 2007/0259110 A1 | 11/2007 | Mahajani et al. |
| 2007/0281495 A1 | 12/2007 | Mallick et al. |
| 2007/0298585 A1 | 12/2007 | Lubomirsky et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |
| 2008/0085610 A1 | 4/2008 | Wang et al. |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0207007 A1 | 8/2008 | Thridandam et al. |
| 2008/0213479 A1 | 9/2008 | Chou et al. |

(56) References Cited

U.S. PATENT DOCUMENTS

| | | |
|---|---|---|
| 2008/0233762 A1 | 9/2008 | Hong |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0155968 A1 | 6/2009 | Min et al. |
| 2009/0163012 A1 | 6/2009 | Clark et al. |
| 2009/0191687 A1 | 7/2009 | Hong et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2009/0286381 A1 | 11/2009 | van Schravendijk et al. |
| 2010/0022099 A1 | 1/2010 | Van Nooten et al. |
| 2010/0025824 A1 | 2/2010 | Chen et al. |
| 2010/0048011 A1 | 2/2010 | Yeh et al. |
| 2010/0051578 A1 | 3/2010 | Chang et al. |
| 2010/0051579 A1 | 3/2010 | Kobayashi |
| 2010/0078316 A1 | 4/2010 | Edakawa et al. |
| 2010/0096687 A1 | 4/2010 | Balseanu et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0120262 A1 | 5/2010 | Vorsa et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0144162 A1 | 6/2010 | Lee et al. |
| 2010/0167555 A1 | 7/2010 | Maula et al. |
| 2010/0190353 A1 | 7/2010 | Nguyen et al. |
| 2010/0197129 A1 | 8/2010 | Ishikawa |
| 2010/0216268 A1 | 8/2010 | Katayama et al. |
| 2010/0221925 A1 | 9/2010 | Lee et al. |
| 2010/0244114 A1 | 9/2010 | Konno et al. |
| 2010/0255218 A1 | 10/2010 | Oka et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0121354 A1 | 5/2011 | Schmid et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0176967 A1 | 7/2011 | Okuda et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0064682 A1 | 3/2012 | Jang et al. |
| 2012/0074844 A1 | 3/2012 | York et al. |
| 2012/0077349 A1 | 3/2012 | Li et al. |
| 2012/0086048 A1 | 4/2012 | Park et al. |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0043512 A1* | 2/2013 | Huang ............. H01L 21/02164 257/288 |
| 2013/0058161 A1 | 3/2013 | Yamanaka et al. |
| 2013/0058162 A1 | 3/2013 | Yamanaka et al. |
| 2013/0065404 A1 | 3/2013 | Weidman et al. |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |
| 2013/0323923 A1* | 12/2013 | Koehler ............. H01L 21/0217 438/595 |
| 2013/0344248 A1 | 12/2013 | Clark |
| 2014/0030444 A1 | 1/2014 | Swaminathan et al. |
| 2014/0051262 A9 | 2/2014 | Lavoie et al. |
| 2014/0087066 A1 | 3/2014 | Wang et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0262038 A1 | 9/2014 | Wang et al. |
| 2014/0264555 A1 | 9/2014 | Ahn et al. |
| 2014/0273428 A1 | 9/2014 | Shero et al. |
| 2014/0295084 A1 | 10/2014 | Shirai et al. |
| 2014/0302686 A1 | 10/2014 | Pan et al. |
| 2015/0041867 A1 | 2/2015 | Han |
| 2015/0093902 A1 | 4/2015 | Huang et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2015/0294905 A1 | 10/2015 | Wu et al. |
| 2016/0020092 A1 | 1/2016 | Kang et al. |
| 2016/0064211 A1 | 3/2016 | Swaminathan et al. |
| 2016/0118246 A1 | 4/2016 | Kang et al. |
| 2016/0148800 A1 | 5/2016 | Henri et al. |
| 2016/0148806 A1 | 5/2016 | Henri et al. |
| 2016/0155676 A1 | 6/2016 | Kang et al. |
| 2016/0163539 A9 | 6/2016 | Kang et al. |
| 2016/0163972 A1 | 6/2016 | Swaminathan et al. |
| 2016/0240428 A1 | 8/2016 | Tung et al. |
| 2016/0251756 A1 | 9/2016 | Lansalot-Matras et al. |
| 2016/0293398 A1 | 10/2016 | Danek et al. |
| 2016/0293838 A1 | 10/2016 | Swaminathan et al. |
| 2016/0322371 A1 | 11/2016 | Yonemochi |
| 2016/0329206 A1 | 11/2016 | Kumar et al. |
| 2016/0329423 A1 | 11/2016 | Kawahara et al. |
| 2016/0336178 A1 | 11/2016 | Swaminathan et al. |
| 2016/0340782 A1 | 11/2016 | Chandrasekharan et al. |

(56) References Cited

U.S. PATENT DOCUMENTS

| | | |
|---|---|---|
| 2016/0365425 A1 | 12/2016 | Chen et al. |
| 2016/0379826 A9 | 12/2016 | Arghavani et al. |
| 2017/0009346 A1 | 1/2017 | Kumar et al. |
| 2017/0092735 A1 | 3/2017 | Hashemi et al. |
| 2017/0103891 A1 | 4/2017 | Lee et al. |
| 2017/0110364 A1 | 4/2017 | Song et al. |
| 2017/0110533 A1 | 4/2017 | Huang et al. |
| 2017/0117134 A1 | 4/2017 | Henri et al. |
| 2017/0117150 A1 | 4/2017 | Liao et al. |
| 2017/0140926 A1 | 5/2017 | Pore et al. |
| 2017/0148628 A1 | 5/2017 | Swaminathan et al. |
| 2017/0170026 A1 | 6/2017 | Hudson et al. |
| 2017/0226637 A1 | 8/2017 | Lubomirsky et al. |
| 2017/0263450 A1 | 9/2017 | Swaminathan et al. |
| 2017/0316988 A1 | 11/2017 | Kang et al. |
| 2017/0323786 A1 | 11/2017 | Kang et al. |
| 2018/0005801 A1 | 1/2018 | Singhal et al. |
| 2018/0005814 A1 | 1/2018 | Kumar et al. |
| 2018/0061628 A1 | 3/2018 | Ou et al. |
| 2018/0138028 A1 | 5/2018 | Henri et al. |
| 2018/0269061 A1 | 9/2018 | Arghavani et al. |
| 2018/0323057 A1 | 11/2018 | Kumar et al. |
| 2019/0080903 A1 | 3/2019 | Abel et al. |
| 2019/0311897 A1 | 10/2019 | Kang et al. |
| 2019/0385820 A1 | 12/2019 | Singhal et al. |
| 2019/0385850 A1 | 12/2019 | Arghavani et al. |

FOREIGN PATENT DOCUMENTS

| | | |
|---|---|---|
| CN | 1926668 A | 3/2007 |
| CN | 101006195 A | 7/2007 |
| CN | 101255548 A | 9/2008 |
| CN | 101328578 A | 12/2008 |
| CN | 101378007 A | 3/2009 |
| CN | 101416293 A | 4/2009 |
| CN | 101535524 A | 9/2009 |
| CN | 101736326 A | 6/2010 |
| CN | 101889331 A | 11/2010 |
| CN | 102005462 A | 4/2011 |
| CN | 102191479 A | 9/2011 |
| CN | 102471885 A | 5/2012 |
| CN | 102687249 A | 9/2012 |
| CN | 102906304 A | 1/2013 |
| CN | 103137864 A | 6/2013 |
| CN | 103928396 A | 7/2014 |
| CN | 105391427 A | 3/2016 |
| CN | 105719954 A | 6/2016 |
| EP | 0 277 766 | 8/1988 |
| EP | 0 541 212 | 5/1993 |
| EP | 1 081 754 A2 | 7/2001 |
| EP | 1 703 552 A2 | 9/2006 |
| EP | 2 278 046 | 1/2011 |
| JP | S48-043472 A | 6/1973 |
| JP | H02-093071 A | 4/1990 |
| JP | H03-011635 | 1/1991 |
| JP | 05-226279 | 9/1993 |
| JP | H06-177120 A | 6/1994 |
| JP | H09-102494 A | 4/1997 |
| JP | H09-219401 A | 8/1997 |
| JP | 10-98032 | 4/1998 |
| JP | H10-189467 A | 7/1998 |
| JP | H11-172439 | 6/1999 |
| JP | 2001-274404 | 10/2001 |
| JP | 2001-338922 A | 12/2001 |
| JP | 2002-009072 | 1/2002 |
| JP | 2002-134497 A | 5/2002 |
| JP | 2002-164345 A | 6/2002 |
| JP | 2002-539640 A | 11/2002 |
| JP | 2005-210076 A | 8/2005 |
| JP | 2005-310927 | 11/2005 |
| JP | 2006-060091 | 3/2006 |
| JP | 2006-303431 A | 11/2006 |
| JP | 2007-165883 | 6/2007 |
| JP | 2007-180362 A | 7/2007 |
| JP | 2007-189173 A | 7/2007 |
| JP | 2007-521658 A | 8/2007 |
| JP | 2007-287889 A | 11/2007 |
| JP | 2007-287890 A | 11/2007 |
| JP | 2008-500742 A | 1/2008 |
| JP | 2008-506262 A | 2/2008 |
| JP | 2008-060455 A | 3/2008 |
| JP | 2008-109093 A | 5/2008 |
| JP | 2008-517479 | 5/2008 |
| JP | 2008-522405 A | 6/2008 |
| JP | 2008-182199 A | 8/2008 |
| JP | 2008-258591 A | 10/2008 |
| JP | 2008-294260 A | 12/2008 |
| JP | 2008-306093 A | 12/2008 |
| JP | 2009-65203 A | 3/2009 |
| JP | 2009-170823 A | 7/2009 |
| JP | 2009-540128 A | 11/2009 |
| JP | 4364320 B2 | 11/2009 |
| JP | 2010-10497 | 1/2010 |
| JP | 2010-043081 A | 2/2010 |
| JP | 2010-103484 A | 5/2010 |
| JP | 2010-118664 A | 5/2010 |
| JP | 2010-152136 | 7/2010 |
| JP | 2010-183069 A | 8/2010 |
| JP | 2010-530127 | 9/2010 |
| JP | 2010-245518 A | 10/2010 |
| JP | 2010-251654 A | 11/2010 |
| JP | 2010-283388 A | 12/2010 |
| JP | 2010-539730 A | 12/2010 |
| JP | 2011-023576 A | 2/2011 |
| JP | 2011-023655 A | 2/2011 |
| JP | 2011-054968 A | 3/2011 |
| JP | 11-067744 | 4/2011 |
| JP | 2011-187934 A | 9/2011 |
| JP | 2012-506640 A | 3/2012 |
| JP | 2012-199306 | 10/2012 |
| JP | 2013-102130 A | 5/2013 |
| JP | 2013166965 A | 8/2013 |
| JP | 2013-196822 A | 9/2013 |
| JP | 2013225655 A | 10/2013 |
| JP | 2013-240042 A | 11/2013 |
| JP | 2014-532304 A | 12/2014 |
| KR | 10-2001-0111448 | 12/2001 |
| KR | 10-0356473 B1 | 10/2002 |
| KR | 10-2004-0001036 | 1/2004 |
| KR | 10-2006-0056883 | 5/2006 |
| KR | 10-0721503 B1 | 5/2007 |
| KR | 10-2007-0060104 | 6/2007 |
| KR | 10-0734748 B | 7/2007 |
| KR | 10-2009-0057665 | 6/2009 |
| KR | 10-2009-0080019 | 7/2009 |
| KR | 10-2009-0081396 | 7/2009 |
| KR | 10-2009-0116433 | 11/2009 |
| KR | 10-2010-0133377 | 12/2010 |
| KR | 10-2011-0086090 | 7/2011 |
| KR | 10-20130056608 A | 5/2013 |
| KR | 10-2015-0025224 | 3/2015 |
| TW | 483103 B | 4/2002 |
| TW | 200701341 | 1/2007 |
| TW | 2007/21306 | 6/2007 |
| TW | 201009942 A | 3/2010 |
| TW | 201042706 A1 | 12/2010 |
| TW | 2011/13934 A1 | 4/2011 |
| TW | 201140695 A1 | 11/2011 |
| TW | 201144475 A1 | 12/2011 |
| WO | WO 2004/032196 | 4/2004 |
| WO | WO 2006/014471 | 2/2006 |
| WO | WO 2006/018441 | 2/2006 |
| WO | WO 2006/026350 | 3/2006 |
| WO | WO 2006/104741 | 10/2006 |
| WO | WO 2007/043709 | 4/2007 |
| WO | WO 2007/118026 | 10/2007 |
| WO | WO 2011/087580 | 7/2011 |
| WO | WO 2011/087850 | 7/2011 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |

(56) References Cited

FOREIGN PATENT DOCUMENTS

| WO | WO 2013/043330 | 3/2013 |
|---|---|---|
| WO | WO 2013/065806 | 5/2013 |
| WO | WO 2013/095396 | 6/2013 |
| WO | WO 2013/112727 | 8/2013 |

OTHER PUBLICATIONS

U.S. Final Office Action dated Sep. 13, 2013 issued in U.S. Appl. No. 13/084,399.
U.S. Notice of Allowance dated Jan. 15, 2014 issued in U.S. Appl. No. 13/084,399.
U.S. Office Action dated Jan. 2, 2015 issued in U.S. Appl. No. 14/231,554.
U.S. Final Office Action dated Jun. 10, 2015 issued in U.S. Appl. No. 14/231,554.
U.S. Notice of Allowance dated Aug. 31, 2015 issued in U.S. Appl. No. 14/231,554.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Apr. 13, 2011 issued in U.S. Appl. No. 12/889,132.
U.S. Notice of Allowance dated Sep. 30, 2011 issued in U.S. Appl. No. 12/889,132.
U.S. Office Action dated Aug. 1, 2012 issued in U.S. Appl. No. 13/011,569.
U.S. Final Office Action dated Feb. 26, 2013 issued in U.S. Appl. No. 13/011,569.
U.S. Notice of Allowance dated May 6, 2013 issued in U.S. Appl. No. 13/011,569.
U.S. Office Action dated Jul. 1, 2016 issued in U.S. Appl. No. 13/963,212.
U.S. Office Action dated Jan. 12, 2017 issued in U.S. Appl. No. 13/963,212.
U.S. Final Office Action dated Jun. 28, 2017 issued in U.S. Appl. No. 13/963,212.
U.S. Office Action dated Jan. 24, 2018 issued in U.S. Appl. No. 13/963,212.
U.S. Office Action dated Apr. 4, 2013 issued U.S. Appl. No. 13/242,084.
U.S. Notice of Allowance dated Jun. 19, 2013 issued U.S. Appl. No. 13/242,084.
U.S. Notice of Allowance dated Sep. 19, 2013 issued U.S. Appl. No. 13/242,084.
U.S. Office Action dated Sep. 21, 2015 issued U.S. Appl. No. 14/607,997.
U.S. Final Office Action dated Mar. 18, 2016 issued U.S. Appl. No. 14/607,997.
U.S. Notice of Allowance dated Jun. 16, 2016 issued U.S. Appl. No. 14/607,997.
U.S. Notice of Allowance dated Sep. 27, 2016 issued U.S. Appl. No. 14/607,997.
U.S. Office Action dated Sep. 26, 2017 issued in U.S. Appl. No. 15/426,889.
U.S. Notice of Allowance dated Mar. 28, 2018 issued in U.S. Appl. No. 15/426,889.
U.S. Notice of Allowance dated Aug. 7, 2014 issued U.S. Appl. No. 14/133,239.
U.S. Notice of Allowance dated Nov. 26, 2014 issued U.S. Appl. No. 14/133,239.
U.S. Office Action dated Apr. 29, 2013 issued U.S. Appl. No. 13/224,240.
U.S. Final Office Action dated Nov. 22, 2013 issued U.S. Appl. No. 13/224,240.
U.S. Examiner's Answer to Appeal Brief (filed May 22, 2014) Before the Patent Trial and Appeal Board dated Aug. 14, 2014 issued U.S. Appl. No. 13/224,240.
U.S. Patent Board Decision on Appeal Before the Patent Trial and Appeal Board (Examiner Affirmed) dated Aug. 11, 2016 issued U.S. Appl. No. 13/224,240.
U.S. Notice of Allowance dated Nov. 17, 2016 issued U.S. Appl. No. 13/224,240.
U.S. Notice of Allowance (Supplemental Notice of Allowability) dated Feb. 21, 2017 issued U.S. Appl. No. 13/224,240.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated May 24, 2013 issued U.S. Appl. No. 13/472,282.
U.S. Notice of Allowance dated Oct. 4, 2013 issued U.S. Appl. No. 13/472,282.
U.S. Office Action dated May 21, 2014 issued in U.S. Appl. No. 13/607,386.
U.S. Notice of Allowance dated Oct. 8, 2014 issued in U.S. Appl. No. 13/607,386.
U.S. Notice of Allowance dated Nov. 19, 2014 issued in U.S. Appl. No. 13/607,386.
U.S. Office Action dated Jun. 13, 2014 issued in U.S. Appl. No. 13/953,616.
U.S. Final Office Action dated Nov. 24, 2014 issued in U.S. Appl. No. 13/953,616.
U.S. Office Action dated Dec. 11, 2014 issued in U.S. Appl. No. 14/074,596.
U.S. Office Action dated Dec. 24, 2015 issued in U.S. Appl. No. 14/074,596.
U.S. Notice of Allowance dated Feb. 12, 2016 issued in U.S. Appl. No. 14/074,596.
U.S. Office Action dated May 15, 2015 issued in U.S. Appl. No. 14/074,617.
U.S. Notice of Allowance dated Nov. 20, 2015 issued in U.S. Appl. No. 14/074,617.
U.S. Office Action dated Dec. 30, 2016 issued in U.S. Appl. No. 15/015,952.
U.S. Notice of Allowance dated Jun. 15, 2017 issued in U.S. Appl. No. 15/015,952.
U.S. Notice of Allowance dated Jan. 29, 2018 issued in U.S. Appl. No. 15/650,662.
U.S. Office Action dated Aug. 14, 2015 issued in U.S. Appl. No. 14/061,587.
U.S. Notice of Allowance dated Feb. 11, 2016 issued in U.S. Appl. No. 14/061,587.
U.S. Notice of Allowance [Supplemental Notice of Allowability] dated Mar. 1, 2016 issued in U.S. Appl. No. 14/061,587.
U.S. Office Action dated Mar. 2, 2015 issued in U.S. Appl. No. 14/137,860.
U.S. Notice of Allowance dated Oct. 1, 2015 issued in U.S. Appl. No. 14/137,860.
U.S. Notice of Allowance [Supplemental Notice of Allowability] dated Oct. 22, 2015 issued in U.S. Appl. No. 14/137,860.
U.S. Office Action dated Feb. 3, 2017 issued in U.S. Appl. No. 14/987,542.
U.S. Notice of Allowance dated Jun. 20, 2017 issued in U.S. Appl. No. 14/987,542.
U.S. Notice of Allowance dated Aug. 22, 2017 issued in U.S. Appl. No. 14/987,542.
U.S. Office Action dated Jul. 10, 2014 issued in U.S. Appl. No. 14/144,107.
U.S. Final Office Action dated Jan. 15, 2015 issued in U.S. Appl. No. 14/144,107.
U.S. Notice of Allowance dated Mar. 19, 2015 issued in U.S. Appl. No. 14/144,107.
U.S. Office Action dated Oct. 21, 2015 issued in U.S. Appl. No. 14/194,549.
U.S. Final Office Action dated Nov. 1, 2016 issued in U.S. Appl. No. 14/194,549.
U.S. Office Action dated Apr. 19, 2017 issued in U.S. Appl. No. 14/194,549.
U.S. Final Office Action dated Sep. 20, 2017 issued in U.S. Appl. No. 14/194,549.

(56) References Cited

OTHER PUBLICATIONS

U.S. Notice of Allowance dated Feb. 14, 2018 issued in U.S. Appl. No. 14/194,549.
U.S. Notice of Allowance dated Aug. 5, 2015 issued in U.S. Appl. No. 14/183,287.
U.S. Office Action dated Aug. 1, 2016 issued in U.S. Appl. No. 14/932,869.
U.S. Office Action dated Jul. 2, 2015 issued in U.S. Appl. No. 14/187,145.
U.S. Final Office Action dated Dec. 16, 2015 issued in U.S. Appl. No. 14/187,145.
U.S. Notice of Allowance dated Feb. 25, 2016 issued in U.S. Appl. No. 14/187,145.
U.S. Office Action dated Jun. 9, 2017 issued in U.S. Appl. No. 15/224,347.
U.S. Notice of Allowance dated Oct. 4, 2017 issued in U.S. Appl. No. 15/224,347.
U.S. Notice of Allowance [Corrected Notice of Allowability] dated Nov. 28, 2017 issued in U.S. Appl. No. 15/224,347.
U.S. Office Action dated Jun. 14, 2016 issued in U.S. Appl. No. 15/019,904.
U.S. Notice of Allowance dated Oct. 13, 2016 issued in U.S. Appl. No. 15/019,904.
U.S. Office Action dated Nov. 25, 2016 issued in U.S. Appl. No. 15/178,474.
U.S. Notice of Allowance dated Feb. 10, 2017 issued in U.S. Appl. No. 15/178,474.
U.S. Notice of Allowance dated Mar. 27, 2017 issued in U.S. Appl. No. 15/178,474.
U.S. Notice of Allowance dated Apr. 18, 2017 issued in U.S. Appl. No. 15/178,474.
U.S. Office Action dated Aug. 22, 2017 issued in U.S. Appl. No. 15/609,864.
U.S. Final Office Action dated Dec. 4, 2017 issued in U.S. Appl. No. 15/609,864.
U.S. Notice of Allowance dated Mar. 9, 2018 issued in U.S. Appl. No. 15/609,864.
U.S. Office Action dated Apr. 13, 2015 issued in U.S. Appl. No. 14/335,785.
U.S. Final Office Action dated Aug. 24, 2016 issued in U.S. Appl. No. 14/335,785.
U.S. Notice of Allowance dated Nov. 4, 2016 issued in U.S. Appl. No. 14/335,785.
U.S. Notice of Allowance dated Feb. 22, 2017 issued in U.S. Appl. No. 14/335,785.
U.S. Notice of Allowance dated Mar. 21, 2017 issued in U.S. Appl. No. 14/335,785.
U.S. Notice of Allowance [Corrected Notice of Allowability] dated Apr. 19, 2017 issued in U.S. Appl. No. 14/335,785.
U.S. Office Action dated May 25, 2016 issued in U.S. Appl. No. 14/552,011.
U.S. Notice of Allowance dated Sep. 26, 2016 issued in U.S. Appl. No. 14/552,011.
U.S. Notice of Allowance dated Sep. 28, 2017 issued in U.S. Appl. No. 15/399,637.
U.S. Notice of Allowance dated Jul. 15, 2016 issued in U.S. Appl. No. 14/678,736.
U.S. Office Action dated Aug. 18, 2017 issued in U.S. Appl. No. 15/201,221.
U.S. Notice of Allowance dated Apr. 9, 2018 issued in U.S. Appl. No. 15/201,221.
U.S. Office Action dated Oct. 6, 2017 issued in U.S. Appl. No. 15/253,301.
U.S. Notice of Allowance dated Mar. 26, 2018 issued in U.S. Appl. No. 15/253,301.
U.S. Notice of Allowance dated Jun. 27, 2017 issued in U.S. Appl. No. 15/199,608.
U.S. Office Action dated Jan. 26, 2018 issued in U.S. Appl. No. 15/683,397.
PCT International Search Report and Written Opinion, dated Oct. 20, 2011, issued in Application No. PCT/US2011/032186.
PCT International Preliminary Report on Patentability, dated Oct. 26, 2012, issued in Application No. PCT/US2011/032186.
Korean Office Action, dated Feb. 7, 2017, issued in Application No. KR 10-2012-7004925.
Korean Office Action, dated Aug. 23, 2017, issued in Application No. KR 10-2017-7020548.
Taiwan Office Action dated Apr. 27, 2016 issued in Application No. TW 100113041.
PCT Invitation to Pay Additional Fees; Communication Re Partial International Search, dated Dec. 16, 2011, issued in Application No. PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action dated Jun. 2, 2015 issued in Application No. CN 201180045808.6.
Chinese Second Office Action dated Feb. 2, 2016 issued in Application No. CN 201180045808.6.
Korean Office Action, dated May 23, 2017, issued in Application No. KR 10-2013-7010291.
Korean Office Action, dated Nov. 27, 2017, issued in Application No. KR 10-2013-7010291.
Taiwan Office Action dated May 5, 2016 issued in Application No. TW 100134208.
Taiwan Office Action dated Oct. 19, 2017 issued in Application No. TW 105130207.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
Chinese First Office Action dated Nov. 19, 2015 issued in Application No. CN 201280046487.6.
Chinese Second Office Action dated Aug. 22, 2016 issued in Application No. CN 201280046487.6.
Japanese Office Action dated Aug. 23, 2016 issued in Application No. JP 2014-531838.
Singapore Supplementary Examination Report dated Jun. 1, 2016 issued in Application No. SG 11201400633R.
Taiwan Notice of Allowance and Search Report dated Dec. 18, 2015 issued in Application No. TW 101134692.
Taiwan First Office Action dated Mar. 14, 2018 issued in Application No. TW 106122777.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
Chinese First Office Action dated Nov. 6, 2015 issued in Application No. CN 201280053888.4.
Chinese Second Office Action dated Aug. 16, 2016 issued in Application No. CN 201280053888.4.
Korean First Office Action dated Oct. 31, 2017 issued in Application No. KR 10-2014-7008696.
Taiwan Office Action and Search Report dated Jan. 27, 2016 issued in Application No. TW 101131556.
Taiwan Office Action and Search Report dated Nov. 9, 2016 issued in Application No. TW 101131556.
Chinese First Office Action dated May 19, 2016 issued in Application No. CN 201310021460.8.
Chinese Second Office Action dated Apr. 13, 2017 issued in Application No. CN 201310021460.8.
Chinese Third Office Action dated Oct. 17, 2017 issued in Application No. CN 201310021460.8.

(56) References Cited

OTHER PUBLICATIONS

European Extended Search Report dated Apr. 14, 2014 issued in Application No. EP 13 15 2046.
European Examination Report dated Dec. 11, 2017 issued in Application No. EP 13 15 2046.
Japanese Office Action dated Jan. 10, 2017 issued in Application No. JP 2013-007612.
Japanese Decision of Rejection dated Jan. 9, 2018 issued in Application No. JP 2013-007612.
Korean Notice of Provisional Rejection dated Dec. 6, 2013 issued in Application No. KR 10-2012-0043797.
Korean Final Office Action dated Aug. 18, 2014 issued in Application No. KR 10-2012-0043797.
Korean Decision from the Patent Tribunal of the KIPO (description) dated May 26, 2015 issued in Application No. KR 10-2012-0043797.
Taiwan Examination Report dated Mar. 29, 2017 issued in Application No. TW 102102054.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Chinese First Office Action dated Feb. 22, 2016 issued in Application No. CN 201380006994.1.
Chinese Second Office Action dated Feb. 6, 2017 issued in Application No. CN 201380006994.1.
Japanese Notification of Reasons for Rejection dated Jan. 10, 2017 issued in Application No. JP2014-554825.
Japanese Decision of Refusal dated Dec. 5, 2017 issued in Application No. JP2014-554825.
Singapore Supplementary Examination Report dated Aug. 11, 2016 issued in Application No. SG 11201404315R.
Taiwan Office Action and Search Report dated Jul. 20, 2016 issued in Application No. TW 102102879.
Taiwan Office Action dated Oct. 25, 2016 issued in Application No. TW 102117772.
Taiwan Rejection Decision dated Aug. 17, 2017 issued in Application No. TW 102117772.
Japanese Office Action dated Oct. 31, 2017 issued in Application No. JP 2013-230782.
Japanese Office Action dated Dec. 5, 2017 issued in Application No. JP 2013-231188.
Taiwan Examination Report dated Jul. 13, 2017 issued in Application No. TW 102140721.
Taiwan Examination Report dated Jan. 11, 2017 issued in Application No. TW 102138326.
Chinese First Office Action dated Nov. 28, 2016 issued in Application No. CN 201410521390.7.
Chinese First Office Action dated May 27, 2017 issued in Application No. CN 201510091775.9.
Chinese Second Office Action dated Mar. 26, 2018 issued in Application No. CN 201510091775.9.
Chinese First Office Action dated Apr. 11, 2016 issued in Application No. CN 201510086588.1.
Chinese Second Office Action dated Mar. 20, 2017 issued in Application No. CN 201510086588.1.
Japanese Office Action dated Apr. 19, 2016 issued in Application No. JP 2015-21804.
Korean First Office Action dated Feb. 19, 2016, issued in Application No. KR 10-2015-0022610.
Korean Final Office Action dated Jun. 29, 2016, issued in Application No. KR 10-2015-0022610.
Chinese Third Office Action dated Dec. 22, 2017, issued in Application No. CN 201380006994.1.
Chinese First Office Action dated Mar. 30, 2018 issued in Application No. CN 201610206201.6.

Cecchi et al., (2007) "Ultra-thin conformal pore-sealing of low-k materials by plasma-assisted ALD," *University of New Mexico, Albuquerque, NM, Sandia National Labs*, Albuquerque, NM, 1 page.
Choi, Gyu-Jin et al., (2009) "Plasma-enhanced atomic layer deposition of $TiO_2$ and AI-doped $TiO_2$ films using $N_2O$ and $O_2$ reactants," *Journal of the Electrochemical Society*, 156(9):G138-G143.
Faraz et al., (2015) "Atomic Layer Etching. What Can We Learn from Atomic Layer Deposition?," *ECS Journal of Solid State Science and Technology*, 4(6):N5023-N5032.
Hausmann et al., (2002) "Atomic Layer Deposition of Hafnium and Zirconium Oxides Using Metal Amide Precursors," *Chem. Mater.* 14(10):4350-4358.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," *Journal of Non-Crystalline Solids*, 338-340:797-801.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$—Ar—$H_2$ plasma treatment for capacitor electrodes," *Materials Letters*, 59:615-617.
Li, Xingcun, et al., (2011) "Atomic Layer Deposition $Al_2O_3$ Thin Films in Magnetized Radio Frequency Plasma Source," *Physics Procedia* 18:100-106.
Man P.F. et al., (Feb. 11-15, 1996) "Elimination of Post-Release Adhesion in Microstructures Using Conformal Fluorocarbon Coatings,"*MEMS '96 Proceedings, IEEE*, pp. 55-60.
Nguyen, S.V. et al., (Jan./Mar. 1999) "Plasma-assist chemical vapor deposition of dielectric thin films for ULSI semiconductor circuits," *IBM J./Res.Develop.* 43(1.2):5-38.
Plasma Enhanced Atomic Layer Deposition (PEALD), Website: http://www.asm.com/index.php?option=com_content&task=view &id=19&Itemid=16 1 (2010), 1 page.
"PlasmaPro™ NGP®80 Range," *Oxford Instruments* (2010), 8 pages.
Pritchett, Merry, (May 2004) "Adherence/Diffusion Barrier Layers for Copper Metallization: Amorphous Carbon: Silicon Polymerized Films," Dissertation Prepared for the Degree of Doctor of Philosophy, *University of Texas*, 113pp.
Puurunen, Riikka L. (2005) "Surface chemistry of atomic layer deposition: A case study for the trimethylaluminum/water process," *Journal of Applied Physics*, 97:121301-1--121301-52.
Van der Straten et al., (2004) "Atomic layer deposition of tantalum nitride for ultrathin liner applications in advanced copper metallization schemes," *Journal of Materials Research*, 19(2):447-453.
U.S. Appl. No. 15/703,917, filed Sep. 13, 2017, Abel et al.
U.S. Appl. No. 15/847,744, filed Dec. 19, 2017, Henri et al.
U.S. Preliminary Amendment dated Feb. 1, 2018 filed in U.S. Appl. No. 15/847,744.
U.S. Office Action dated Nov. 9, 2018 issued in U.S. Appl. No. 15/654,186.
U.S. Notice of Allowance dated Mar. 7, 2019 issued in U.S. Appl. No. 15/654,186.
U.S. Office Action dated Mar. 21, 2019 issued in U.S. Appl. No. 15/976,793.

(56) References Cited

OTHER PUBLICATIONS

U.S. Notice of Allowance dated Oct. 3, 2019 issued in U.S. Appl. No. 15/976,793.
U.S. Office Action dated Jul. 30, 2019 issued in U.S. Appl. No. 15/847,744.
U.S. Office Action dated Mar. 21, 2019 issued in U.S. Appl. No. 16/034,022.
U.S. Final Office Action dated Sep. 27, 2019 issued in U.S. Appl. No. 16/034,022.
U.S. Final Office Action dated Nov. 16, 2018 issued in U.S. Appl. No. 15/683,397.
U.S. Notice of Allowance dated Mar. 28, 2019 issued in U.S. Appl. No. 15/683,397.
U.S. Office Action dated Jul. 18, 2018 issued in U.S. Appl. No. 15/703,917.
U.S. Notice of Allowance dated Dec. 5, 2018 issued in U.S. Appl. No. 15/703,917.
Korean Decision for Grant of Patent, dated Jul. 25, 2018, issued in Application No. KR 10-2013-7010291.
Korean First Office Action dated Oct. 2, 2018 issued in Application No. KR 10-2014-7010949.
Korean First Office Action dated Aug. 19, 2019 issued in Application No. KR 10-2019-7012231.
Taiwan Second Office Action dated Dec. 14, 2018 issued in Application No. TW 106122777.
Japanese Notice of Reason for Refusal dated Jul. 24, 2018 issued in Application No. JP 2017-159931.
Japanese Second Office Action dated Jun. 17, 2019 issued in Application No. JP 2017-159931.
Korean Second Office Action dated Sep. 20, 2018 issued in Application No. KR 10-2014-7008696.
Korean Decision for Grant of Patent, dated May 17, 2019 issued in Application No. KR 10-2014-7008696.
Chinese Fourth Office Action dated May 16, 2018 issued in Application No. CN 201310021460.8.
Japanese Reason for Refusal dated Apr. 2, 2019 issued in Application No. JP 2013-007612.
Japanese First Office Action dated May 29, 2019 issued in Application No. JP 2018-090402.
Korean First Office Action dated Jun. 28, 2019 issued in Application No. KR 10-2013-0056776.
Japanese Second Office Action dated May 22, 2018 issued in Application No. JP 2013-230782.
Japanese Decision to Grant dated Sep. 10, 2018 issued in Application No. JP 2013-230782.
Japanese Second Office Action [Decision of Rejection] dated Dec. 4, 2018 issued in Application No. JP 2013-231188.
Taiwan First Office Action dated Sep. 20, 2018 issued in Application No. TW 106140906.
Taiwan First Office Action dated May 3, 2018 issued in Application No. TW 103133765.
Japanese First Office Action dated Dec. 18, 2018 issued in Application No. JP 2014-262248.
Singapore Eligibility to Grant w/Supplemental Examination Report dated Apr. 23, 2019 issued in Application No. SG 10201408801Q.
Taiwan First Office Action dated Jun. 26, 2018 issued in Application No. TW 103145386.
Chinese Third Office Action dated Oct. 15, 2018 issued in Application No. CN 201510091775.9.
Chinese Fourth Office Action dated Mar. 27, 2019 issued in Application No. CN 201510091775.9.
Taiwanese First Office Action dated Sep. 14, 2018 issued in Application No. TW 104106165.
Taiwan Notice of Allowance and Search Report dated Aug. 30, 2018 issued in Application No. TW 104104471.
Singapore Search Report and Written Opinion dated Mar. 14, 2019 issued in Application No. SG 10201807090Q.
Taiwan First Office Action dated Sep. 13, 2018, issued in Application No. TW 104104648.
Taiwanese First Office Action dated Nov. 9, 2018 issued in Application No. TW 104122669.
Chinese Second Office Action dated Jan. 24, 2019 issued in Application No. CN 201610206201.6.
Taiwan First Office Action dated Oct. 16, 2019 issued in Application No. TW 105109955.
Chinese First Office Action dated Oct. 8, 2018 issued in Application No. CN 201710522311.8.
Chinese Second Office Action dated Jun. 13, 2019 issued in Application No. CN 201710522311.8.
PCT International Search Report and Written Opinion dated Feb. 25, 2019 issued in Application No. PCT/US2018/050049.
Elam et al., (2003) "Growth of ZnO/Al2O3 Alloy Films Using Atomic Layer Deposition Techniques," Chemistry of Materials, 2003, vol. 15, No. 4, pp. 1020-1028. <doi:10.1021/cm020607+>.
U.S. Appl. No. 16/036,784, filed Jul. 16, 2018, Ou et al.
U.S. Final Office Action dated Jan. 21, 2020 issued in U.S. Appl. No. 15/847,744.
Notice of Allowance dated Feb. 7, 2020 issued in U.S. Appl. No. 16/034,022.
U.S. Office Action dated Feb. 14, 2020 issued in U.S. Appl. No. 16/453,237.
Chinese First Office Action dated Jan. 20, 2020 issued in Application No. CN 201710347032.2.
Japanese Third Office Action dated Mar. 10, 2020 issued in Application No. JP 2017-159931.
Japanese Second Office Action [Decision of Rejection] dated Jan. 14, 2020 issued in Application No. JP 2018-090402.
Korean First Office Action dated Jan. 15, 2020 issued in Application No. KR 10-2013-0135907.
Singapore Second Written Opinion dated Jan. 24, 2020 issued in Application No. SG 10201807090Q.

* cited by examiner

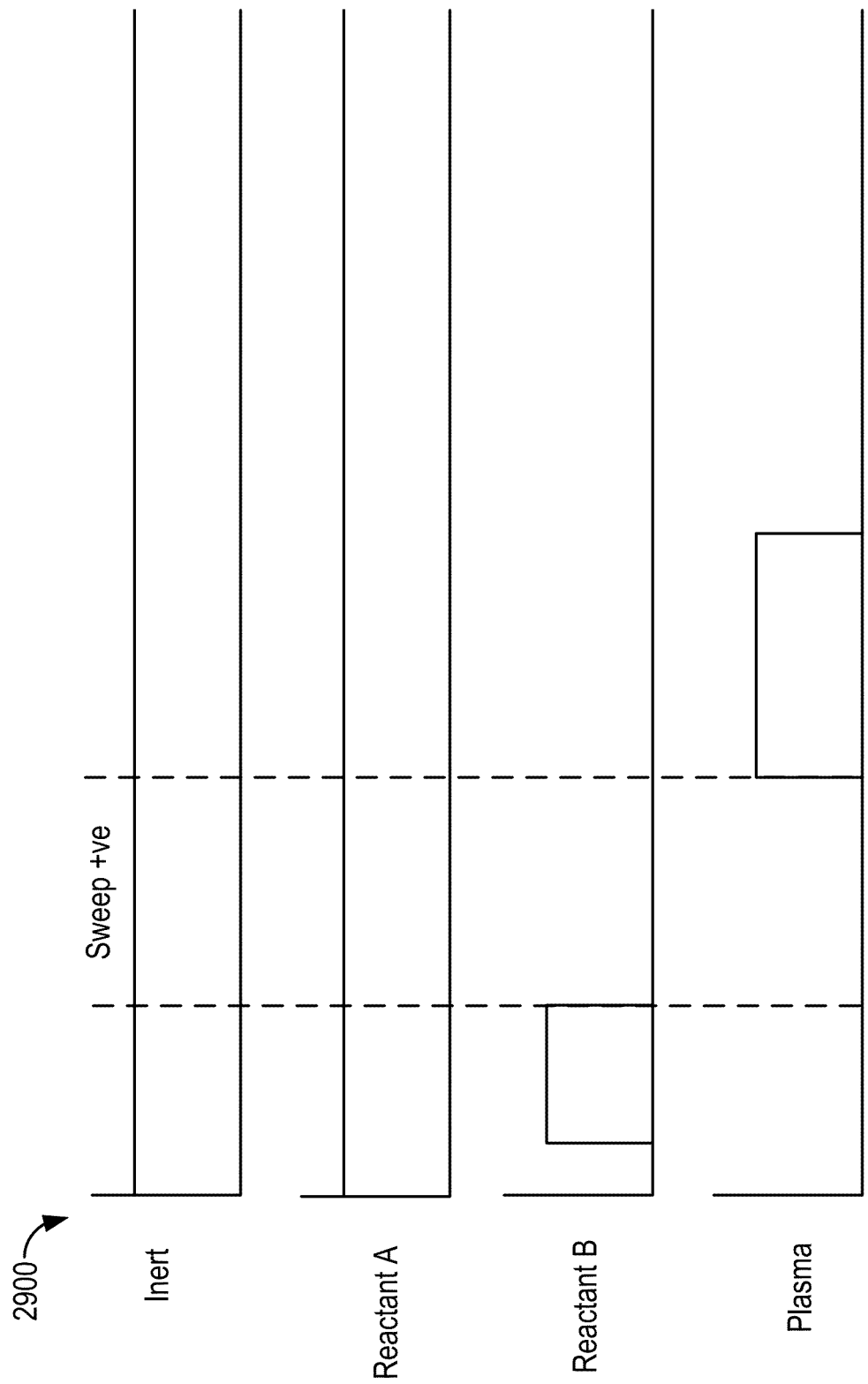

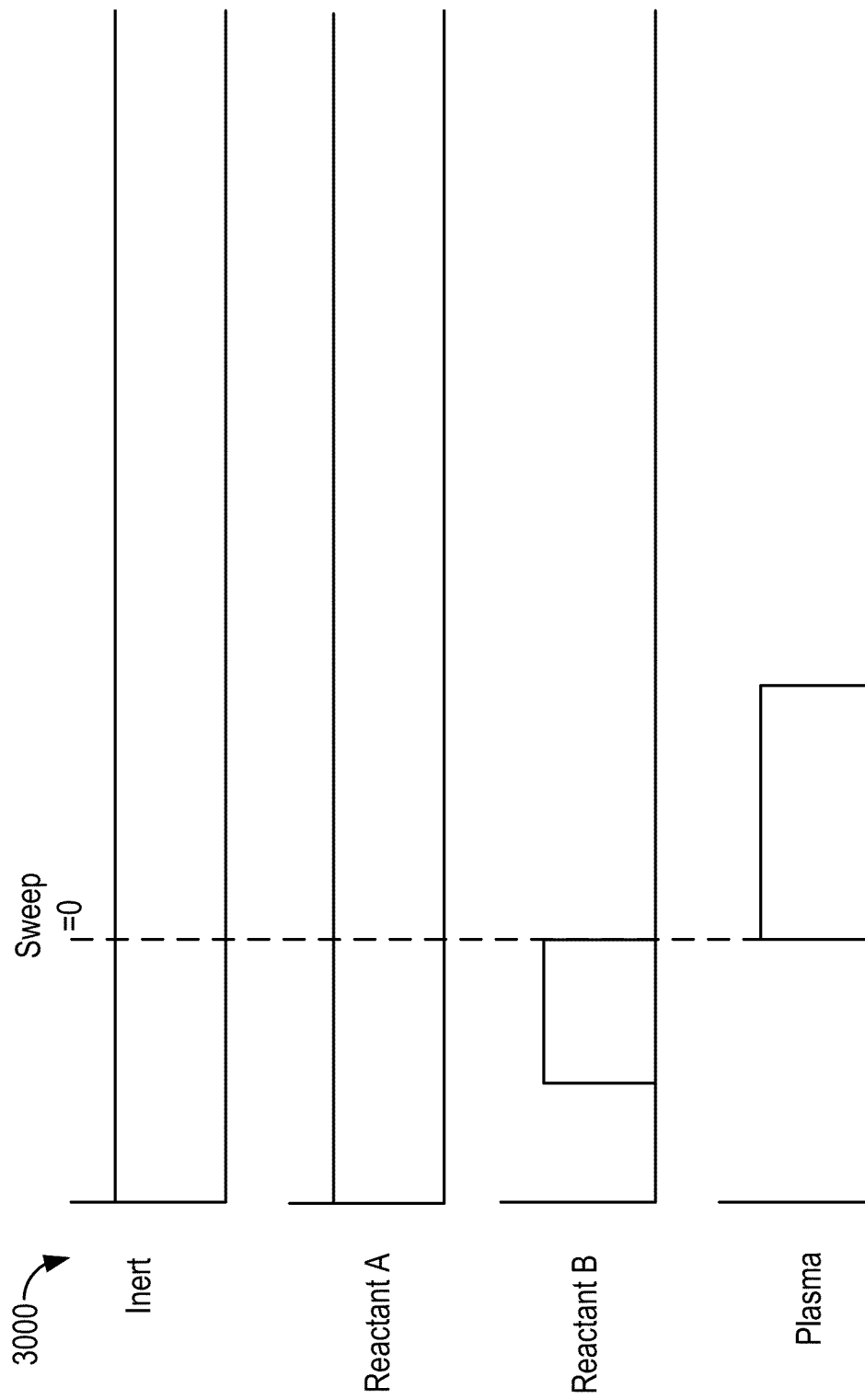

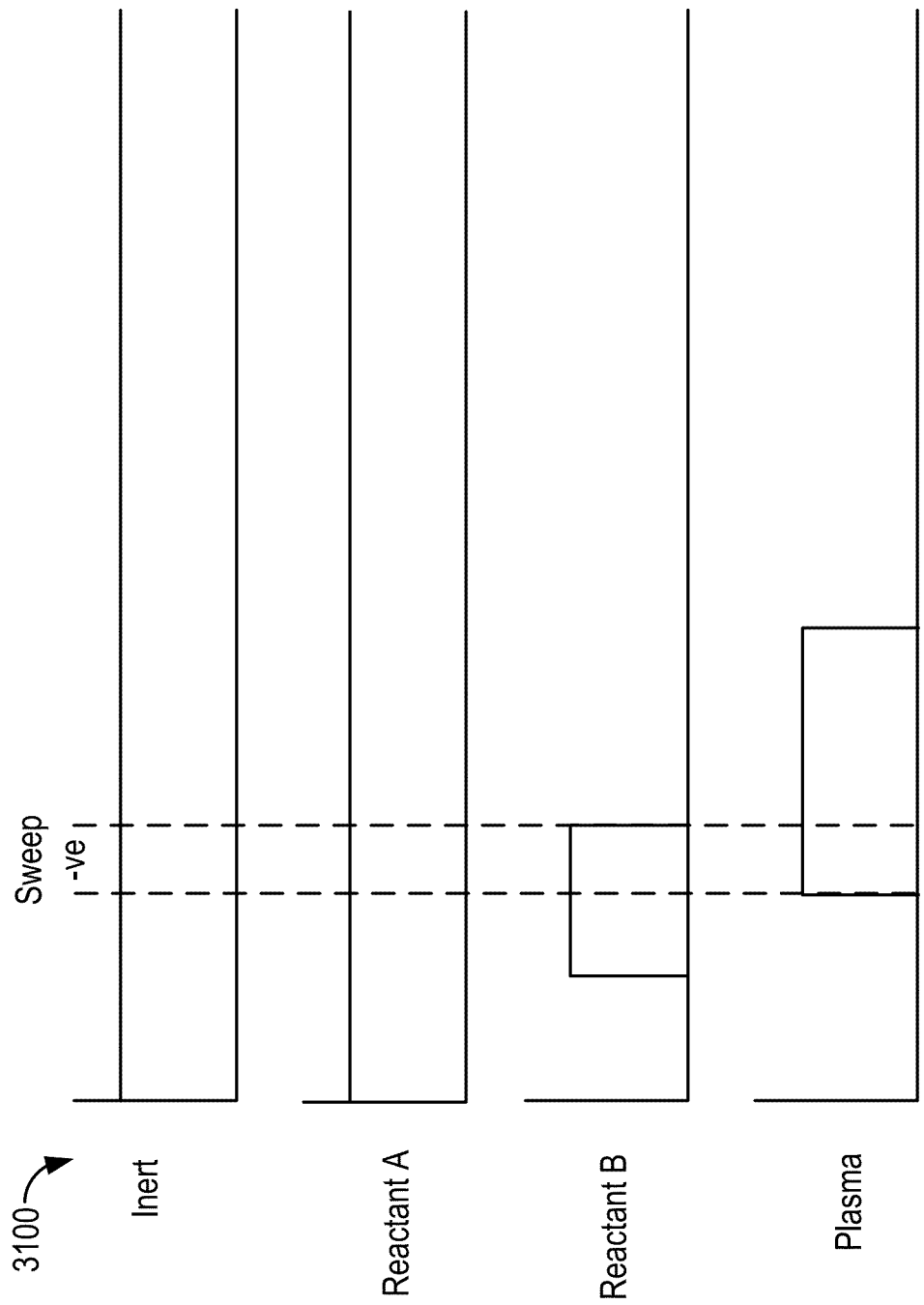

METHODS FOR DEPOSITING FILMS ON SENSITIVE SUBSTRATES

CROSS-REFERENCE TO RELATED APPLICATIONS

This application is a continuation of and claims priority to U.S. patent application Ser. No. 15/650,662 filed Jul. 14, 2017, titled "METHODS FOR DEPOSITING FILMS ON SENSITIVE SUBSTRATES," which is a divisional of U.S. application Ser. No. 15/015,952 (issued as U.S. Pat. No. 9,786,570), filed Feb. 4, 2016, titled "METHODS FOR DEPOSITING FILMS ON SENSITIVE SUBSTRATES," which is a divisional of U.S. patent application Ser. No. 14/074,617 (issued as U.S. Pat. No. 9,287,113), filed Nov. 7, 2013, titled "METHODS FOR DEPOSITING FILMS ON SENSITIVE SUBSTRATES," which claims benefit of priority to U.S. Provisional Patent Application No. 61/724,217, filed Nov. 8, 2012, and titled "METHODS FOR DEPOSITING FILMS ON SENSITIVE SUBSTRATES," each of which is incorporated herein by reference in its entirety and for all purposes.

BACKGROUND

One of the processes frequently employed during the fabrication of semiconductor devices is the deposition of various films such as oxides and nitrides onto a substrate. In some cases, the substrate is particularly sensitive to oxidation or nitridation during the deposition, which can damage the substrate. This sensitivity is especially likely to arise in applications such as gapfill and double-patterning, though it may be problematic in other contexts as well. Examples of sensitive substrates include silicon (Si), cobalt (Co), germanium-antimony-tellurium alloy (GST), silicon-germanium (SiGe), silicon nitride (SiN), silicon carbide (SiC), and silicon oxide ($SiO_2$). As such, there exists a need for a method of depositing semiconductor films that prevents damage to sensitive substrates. In some embodiments, the method prevents oxidation of oxidation-sensitive substrates, and/or nitridation of nitridation-sensitive substrates.

SUMMARY

Various aspects disclosed herein pertain to methods of depositing a film on an exposed surface of an oxidation-sensitive substrate surface. These methods typically include surface mediated reactions in which a film is grown over multiple cycles of reactant adsorption and reaction. In one such aspect, the method is characterized by the following operations: (a) exposing the oxidation-sensitive substrate to a silicon-containing reactant in vapor phase; (b) exposing the oxidation-sensitive substrate to an oxidizing reactant in vapor phase in a station of a reaction chamber; and (c) periodically igniting a plasma in the reaction chamber using a high frequency radio frequency between about 12.5 and 125 W/station when the flow of the silicon-containing reactant has ceased. In some implementations of this method, the oxidizing reactant flows continuously to the substrate and the silicon-containing reactant flows intermittently to the substrate. In other implementations, the oxidizing reactant is pulsed into the reaction chamber.

In some implementations, the thickness of the resulting silicon oxide film is between about 10-50 Å. In some embodiments, the substrate is kept between about 25-450° C., and in some cases is kept between about 25-100° C., between about 50-150° C., or between about 50-200° C. The oxidation reactant may be a mixture of oxygen ($O_2$) and a weak oxidizer such as nitrous oxide ($N_2O$), carbon monoxide (CO), carbon dioxide ($CO_2$), nitric oxide (NO), nitrogen dioxide ($NO_2$), sulfur oxide (SO), sulfur dioxide ($SO_2$), oxygen-containing hydrocarbons ($C_xH_yO_z$) and/or water ($H_2O$). In other implementations, the oxidation reactant may be entirely weak oxidizer. Alternatively, the oxidation reactant may include ozone ($O_3$). In some embodiments, the oxidation reactant is about 0-50% $O_2$ and about 50-100% weak oxidizer. The radio frequency may be further limited in some implementations to between 50 and 125 W/station.

In some embodiments, the method described above is further characterized by the deposition of a second silicon oxide material through the following sequence of operations: (d) exposing the oxidation-sensitive substrate to a second silicon-containing reactant in vapor phase; (e) exposing the oxidation-sensitive substrate to a second oxidizing reactant in vapor phase; and (f) periodically igniting the plasma in the reaction chamber using a high frequency radio frequency between about 250 and 1500 W/station when the vapor phase flow of the second silicon-containing reactant has ceased. In some implementations, operations (d)-(f) are performed between about 50 and 400° C., while in some cases these operations are limited to 150-250° C. or 300-400° C. While operations (a)-(f) may be performed isothermally in some embodiments, in other embodiments operations (a)-(c) and operations (d)-(f) are performed at different temperatures.

In some implementations, the first silicon oxide material and the second silicon oxide material each form layers of a bilayer. The first silicon oxide material may be referred to as the protective layer, and the second silicon oxide material may be referred to as the electrically favorable layer. In one embodiment, the thickness of the protective layer is between about 1 and about 20% of the total thickness of the bilayer.

In one embodiment, operations (a)-(c) and operations (d)-(f) utilize the same rate and/or composition of vapor phase flow of the silicon-containing reactant. In other embodiments, either the rate and/or the composition of the vapor phase flow of the silicon-containing reactant will be different between the two sets of operations. Specifically, in one implementation, the vapor phase flow of silicon-containing reactant during operations (d)-(f) contains a higher percentage of $O_2$ as compared to the flow during operations (a)-(c). Though in some embodiments the vapor phase flow of oxidizing reactant is continuous, in other embodiments this flow is pulsed into the reaction chamber.

While many of the specifically disclosed operations relate to a silicon-based oxidation-sensitive substrate, the methods may be used on many different types of oxidation sensitive substrate surfaces. Group 4-11 metals, silicon, amorphous silicon, carbon films (including films deposited through plasma enhanced chemical vapor deposition or spin on techniques, for example), and group III-V materials are likely to be sensitive substrates. For example, in some implementations the substrate surface may be Cobalt (Co), germanium-antimony-tellurium, silicon-germanium, silicon nitride, silicon carbide, tungsten (W), titanium (Ti), tantalum (Ta), chromium (Cr), nickel (Ni), palladium (Pd), ruthenium (Ru), or silicon oxide. One of ordinary skill in the art would understand that the methods described herein can be used on a variety of oxidation-sensitive substrates not limited to those mentioned above.

In some implementations, no more than about 2 Å of the oxidation-sensitive substrate is oxidized.

In another aspect, a method of forming a silicon oxide material on an exposed surface of an oxidation-sensitive substrate may be characterized by the following sequence of operations: (a) exposing the oxidation-sensitive substrate to a silicon-containing reactant in vapor phase; (b) exposing the oxidation-sensitive substrate to an oxidation reactant in vapor phase in a station of a reaction chamber maintained between about 25-200° C.; and (c) igniting a plasma in the reaction chamber when the vapor phase flow of the silicon-containing reactant has ceased.

In one embodiment, the resulting silicon oxide material is between about 10 and about 50 Å. According to various implementations, the plasma is ignited using a high frequency radio frequency between about 12.5 and about 125 W/station and in some implementations this range is limited to between about 50 and about 125 W/station.

The oxidation reactant may be a mixture of $O_2$ and weak oxidizer such as $N_2O$, CO, $CO_2$, NO, $NO_2$, SO, $SO_2$, $C_xH_yO_z$ and/or $H_2O$. In other implementations, the oxidation reactant may be entirely weak oxidizer. Alternatively, the oxidation reactant may include $O_3$. In some embodiments, the oxidation reactant is about 0-50% $O_2$ and about 50-100% weak oxidizer.

In some embodiments, the method described above is further characterized by the deposition of a second silicon oxide material through the following sequence of operations: (d) exposing the oxidation-sensitive substrate to a second silicon-containing reactant in vapor phase in a station of a reaction chamber maintained at a temperature at least about 50° C. higher than during operations (a)-(c); (e) exposing the oxidation-sensitive substrate to a second vapor phase flow of a second oxidation reactant; and (f) igniting the plasma in the reaction chamber using a high frequency radio frequency when the vapor phase flow of the second silicon-containing reactant has ceased.

In some implementations, steps (d)-(f) are performed between about 300 and about 400° C. In some embodiments, the first silicon oxide material and the second silicon oxide material each form layers of a bilayer. The first silicon oxide material may be referred to as the protective layer, and the second silicon oxide material may be referred to as the electrically favorable layer. In one embodiment, the thickness of the protective layer is between about 1 and about 20% of the total thickness of the bilayer.

While many of the specifically disclosed operations relate to a silicon-based oxidation-sensitive substrate, the methods may be used on many different types of oxidation sensitive substrate surfaces. For example, in some implementations the substrate surface may be cobalt, germanium-antimony-tellerium, silicon-germanium, silicon nitride, silicon carbide, or silicon oxide. One of ordinary skill in the art would understand that the methods described herein can be used on a variety of oxidation-sensitive substrates not limited to those mentioned above.

In one implementation, no more than 2 Å of the oxidation-sensitive substrate is oxidized. In some embodiments, operation (f) is performed at RF power between about 250-1500 W/station.

In another aspect, a method of forming a silicon-containing bilayer on a reaction-sensitive substrate may be characterized by the following operations: (a) forming a first layer of a silicon-containing film through a plasma-enhanced atomic layer deposition process; and (b) forming a second layer of the silicon-containing film on the first layer by a plasma-enhanced atomic layer deposition process performed using a higher radio frequency power than that used in operation (a). In a different aspect, a method of forming a silicon-containing bilayer on a reaction-sensitive substrate may be characterized by the following operations: (a) forming a first layer of a silicon-containing film through a plasma-enhanced atomic layer deposition process; and (b) forming a second layer of the silicon-containing film on the first layer by a plasma-enhanced atomic layer deposition process performed using a higher temperature than that used during operation (a). As noted above, the first layer may be referred to as the protective layer and the second layer may be referred to as the electrically favorable layer.

In one embodiment of these methods, the thickness of the protective layer is between about 1 and about 20% of the total thickness of the bilayer. In one implementation, the thickness of the protective layer is between about 10 and about 50 Å.

The oxidation reactant may be a mixture of $O_2$ and weak oxidizer such as $N_2O$, CO, $CO_2$, NO, $NO_2$, SO, $SO_2$, $C_xH_yO_z$ and/or $H_2O$. In other implementations, the oxidation reactant may be entirely weak oxidizer. Alternatively, the oxidation reactant may include $O_3$. In some embodiments, the oxidation reactant is about 0-50% $O_2$ and about 50-100% weak oxidizer.

While many of the specifically disclosed operations relate to a silicon-based oxidation-sensitive substrate, the methods may be used on many different types of oxidation sensitive substrate surfaces. For example, in some implementations the substrate surface may be cobalt, germanium-antimony-tellerium, silicon-germanium, silicon nitride, silicon carbide, or silicon oxide. One of ordinary skill in the art would understand that the methods described herein can be used on a variety of oxidation-sensitive substrates not limited to those mentioned above. In some embodiments, the silicon-containing film is a silicon oxide, a silicon nitride, a silicon carbide, a silicon oxynitride, or a silicon carbide film.

These and other features will be described below with reference to the associated drawings.

BRIEF DESCRIPTION OF THE DRAWINGS

FIGS. 1A-1E provide example timing diagrams for depositing films according to certain disclosed embodiments.

DETAILED DESCRIPTION

Figure 1A:
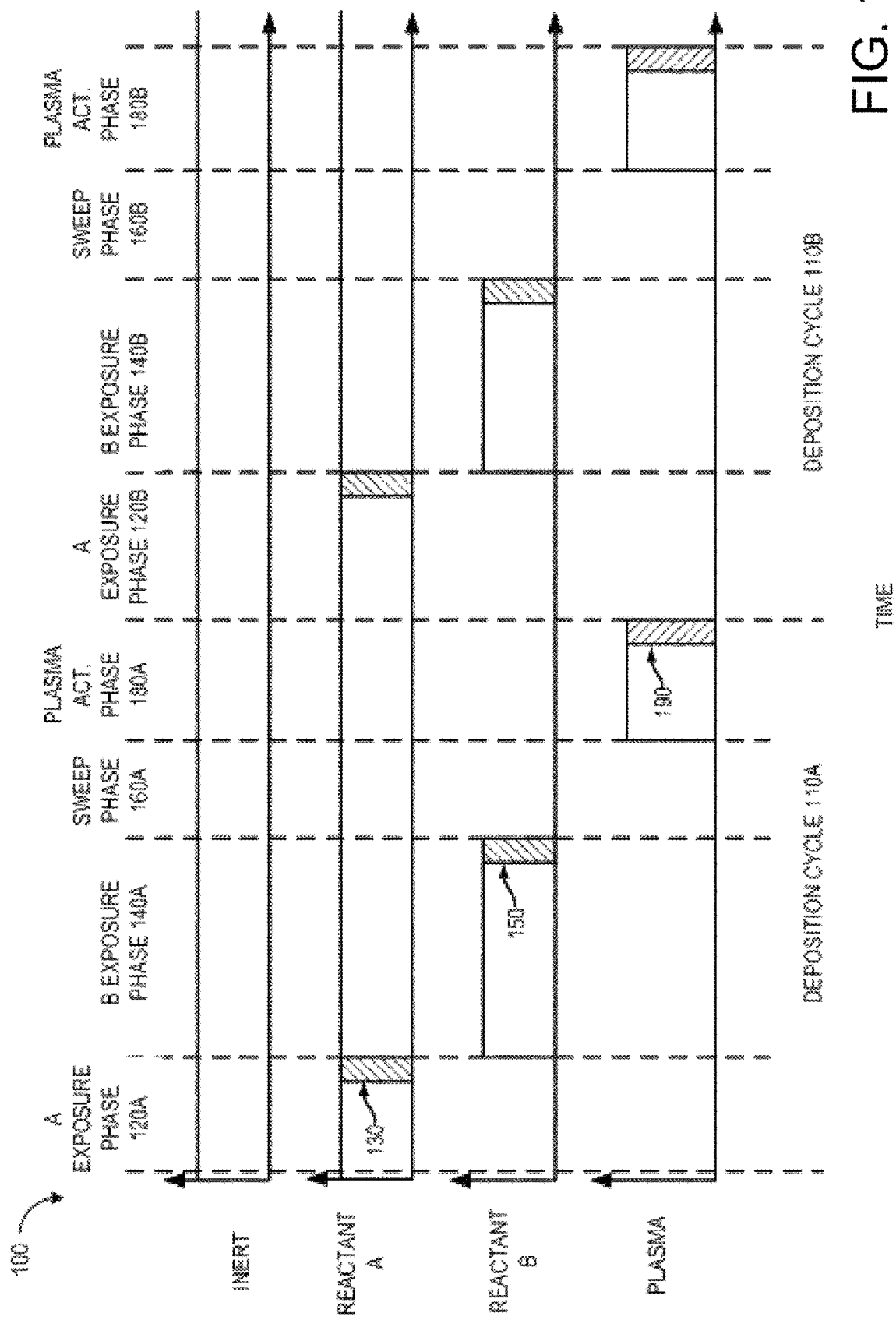

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Various aspects disclosed herein pertain to methods of depositing a film on a substrate surface. These methods include plasma-activated surface-mediated reactions in which a film is grown over multiple cycles of reactant adsorption and reaction. In some implementations, the methods are conformal film deposition (CFD) reactions, with a CFD reaction in which one more reactants adsorb to the substrate surface and then react to form a film on the surface by interaction with plasma.

Conventional methods of depositing oxide layers can result in oxidation damage to sensitive substrates. This damage is problematic for certain applications including, but not limited to, gapfill and double-patterning.

Provided herein are CFD processes and other deposition processes that prevent the oxidation of the substrate on which they are deposited. Also provided are CFD processes and other deposition processes that prevent nitridation of, or other reaction with, an underlying substrate. Generally speaking, the processes may be used to reduce or eliminate unwanted reactions with the sensitive substrate and conversion of a portion of the sensitive substrate to another material. These processes may be especially useful for sensitive substrates such as silicon (Si), cobalt (Co), germanium-antimony-tellerium alloy (GST), silicon-germanium (SiGe), silicon nitride (SiN), silicon carbide (SiC), and silicon oxide ($SiO_2$), and film types such as $SiO_2$, SiN, SiCN, SiC, noble metals, and high K materials including lanthanide-oxides, group 4 metal oxides, and group 5 metal oxides.

In certain embodiments, the damage to the substrate is prevented through the deposition of a thin protective layer, which may be deposited at a relatively low temperature, and/or at a relatively low pressure, and/or at a relatively low level of RF power/flux. In some cases, the protective layer is incorporated into a bilayer structure where the bottom layer is the protective layer and the top layer is an electrically favorable layer. As compared to the electrically favorable layer, the protective layer may be deposited at a lower temperature, and/or lower RF power, and/or shorter RF time, and/or lower pressure, and/or with a different reactant. These deposition conditions may help prevent damage to the underlying substrate while producing an operable device.

Furthermore, various embodiments provided herein relate to methods for evaluating substrate oxidation using a common silicon substrate as a test vehicle, thereby avoiding the complexity of testing oxidation on device substrates.

Also, various embodiments provided herein relate to methods for determining the minimal thickness of a bottom protective layer in a bilayer approach, which thickness will provide adequate protection against substrate oxidation while having minimal impact on bulk film electrical properties.

U.S. patent application Ser. No. 13/084,399, filed Apr. 20, 2011, and titled "PLASMA ACTIVATED CONFORMAL FILM DEPOSITION," which is herein incorporated by reference in its entirety, describes CFD reactions including timing diagrams for various embodiments of plasma-activated CFD processes in which a substrate is exposed to reactants A and B. The methods described herein include such CFD processes. While the description below refers chiefly to the deposition of silicon oxide films from a silicon-containing reactant such as bis(tert-butylamino)silane (BTBAS) and an oxidant reactant, also known as an oxidation reactant, such as oxygen, nitrous oxide or a mixture thereof, the methods described herein may also be used for plasma-activated deposition of other types of films including but not limited to silicon nitrides. Reactants and process flows for the deposition of silicon nitrides and other film types are described in the Ser. No. 13/084,399 application, as well as in U.S. patent application Ser. No. 13/084,305, filed Apr. 11, 2011, and titled "SILICON NITRIDE FILMS AND METHODS," which is herein incorporated by reference in its entirety.

Manufacture of semiconductor devices typically involves depositing one or more thin films on a non-planar substrate in an integrated fabrication process. In some aspects of the integrated process it may be useful to deposit thin films that conform to substrate topography. For example, a silicon nitride film may be deposited on top of an elevated gate stack to act as a spacer layer for protecting lightly-doped source and drain regions from subsequent ion implantation processes.

In spacer layer deposition processes, chemical vapor deposition (CVD) processes may be used to form a silicon nitride film on the non-planar substrate, which is then anisotropically etched to form the spacer structure. However, as a distance between gate stacks decreases, mass transport limitations of CVD gas phase reactions may cause "bread-loafing" deposition effects. Such effects typically exhibit thicker deposition at top surfaces of gate stacks and thinner deposition at the bottom corners of gate stacks. Further, because some die may have regions of differing device density, mass transport effects across the wafer surface may result in within-die and within-wafer film thickness variation. These thickness variations may result in over-etching of some regions and under-etching of other regions. This may degrade device performance and/or die yield.

Some approaches to addressing these issues involve atomic layer deposition (ALD). In contrast with a CVD process, where thermally activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first film precursor (P1). Some molecules of P1 may form a condensed phase atop the substrate surface, including chemisorbed species and physisorbed molecules of P1. The reactor is then evacuated to remove gas phase and physisorbed P1 so that only chemisorbed species remain. A second film precursor (P2) is then introduced to the reactor so that some molecules of P2 adsorb to the substrate surface. The reactor may again be evacuated, this time to remove unbound P2. Subsequently, thermal energy provided to the substrate activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness.

Depending on the exposure time of the precursor dosing steps and the sticking coefficients of the precursors, each ALD cycle may deposit a film layer of, in one example, between one-half and three angstroms thick.

Conformal films may also be deposited on planar substrates. For example, antireflective layers for lithographic patterning applications may be formed from planar stacks comprising alternating film types. Such antireflective layers may be approximately 100 to 1000 angstroms thick, making slower ALD processes less attractive than faster CVD processes. However, such anti-reflective layers may also have a lower tolerance for within-wafer thickness variation than many CVD processes may provide. For example, a 600-angstrom thick antireflective layer may tolerate a thickness range of less than 3 angstroms.

Various embodiments are provided herein providing processes and equipment for plasma-activated ALD and conformal film deposition (CFD) on non-planar and planar substrates. These embodiments are typically performed at relatively low temperature, and/or at a relatively low pressure, and/or at a relatively low level of RF power/flux (i.e., low damage conditions). In some cases, a bilayer approach is used such that a bottom protective layer is formed at low damage conditions, and an upper electrically favorable layer is formed at different conditions.

As indicated above, embodiments described herein can include CFD processes as well as ALD processes. Generally, CFD does not rely on complete purges of one or more reactants prior to reaction to form the film. For example, there may be one or more reactants present in the vapor phase when a plasma (or other activation energy) is struck. Accordingly, one or more of the process steps described in an ALD process may be shortened or eliminated in an example CFD process. Further, in some embodiments, plasma activation of deposition reactions may result in lower deposition temperatures than thermally-activated reactions, potentially reducing the thermal budget of an integrated process. While embodiments include CFD, the methods described herein are not limited to CFD. Other suitable methods include ALD.

For context, a short description of CFD is provided. The concept of a CFD "cycle" is relevant to the discussion of various embodiments herein. Generally a cycle is the minimum set of operations required to perform a surface deposition reaction one time. The result of one cycle is production of at least a partial film layer on a substrate surface. Typically, a CFD cycle will include only those steps necessary to deliver and adsorb each reactant to the substrate surface, and then react those adsorbed reactants to form the partial layer of film. Of course, the cycle may include certain ancillary steps such as sweeping one or more of the reactants or byproducts and/or treating the partial film as deposited. Generally, a cycle contains only one instance of a unique sequence of operations. As an example, a cycle may include the following operations: (i) delivery/adsorption of reactant A, (ii) delivery/adsorption of reactant B, (iii) sweep B out of the reaction chamber, and (iv) apply plasma to drive a surface reaction of A and B to form the partial film layer on the surface.

The description herein uses the terms "principal" and "auxiliary" reactants. As used herein, a principal reactant contains an element that is solid at room temperature, which element is contributed to the film formed by CFD. Examples of such elements are metals (e.g., aluminum, titanium, etc.), semiconductors (e.g., silicon and germanium), and non-metals or metalloids (e.g., boron). As used herein, an auxiliary reactant is any reactant that is not a principal reactant. The term co-reactant is sometimes used to refer to auxiliary reactants. Examples of auxiliary reactants include oxygen, ozone, hydrogen, carbon monoxide, nitrous oxide, ammonia, alkyl amines, and the like.

The embodiments herein may use various different process sequences. One possible process includes the following sequence of operations: (1) flow auxiliary reactant continuously, (2) provide dose of silicon-containing or other principle reactant, (3) purge 1, (4) expose substrate to RF plasma, (5) purge 2. Another alternative process includes the following sequence of operations: (1) flow inert gas continuously, (2) provide dose of silicon-containing or other principle reactant, (3) purge 1, (4) expose substrate to RF plasma while providing dose of oxidant or other auxiliary reactant, (5) purge 2. Other example process flows are shown in FIGS. 1A-1E.

The compounds, flow rates, and dosage times provided herein are examples. Any appropriate silicon-containing reactant and oxidant may be used for the deposition of silicon oxides. Similarly, for the deposition of silicon nitrides, any appropriate silicon-containing reactant and nitrogen-containing reactant may be used. Further, for the deposition of metal oxides or metal nitrides, any appropriate metal-containing reactants and co-reactants may be used. The techniques herein are beneficial in implementing a wide variety of film chemistries. Flow rates and times outside the ranges provided may be appropriate in certain embodiments. Example flow rates are given for 300 mm wafers and may be scaled appropriately for wafers of other sizes. Other process flows may also be used, some of which are described with reference to the timing diagrams shown in FIGS. 1A and 1B, below.

In some cases, one of the reactants may be delivered continuously (e.g., even during delivery of other reactants and/or during plasma exposure). The continuously flowing reactant may be delivered to the reaction chamber in conjunction with a carrier gas—e.g., argon. In some cases, the delivery of the continuously flowing reactants to reaction chamber is controlled by using divert valve/inlet valve toggling. Gas flow changes may be diverted or co-flowed. In one example, a continuously flowing reactant is periodically diverted from the reaction chamber such that it is only delivered to the reaction chamber at certain periods. The continuously flowing gas may be diverted to an outlet/dump using appropriate valves. For instance, an oxidizing reactant may flow continuously, but only be delivered to the reaction chamber periodically. When the oxidizing reactant is not being delivered to the reaction chamber, it may be diverted to an outlet, recycle system, etc.

One advantage of the continuous flow embodiment is that the established flow avoids the delays and flow variations caused by transient initialization and stabilization of flow associated with turning the flow on and off.

As a specific example, an oxide film may be deposited by a conformal film deposition process using a principal reactant (sometimes referred to as a "solid component" precursor or, in this example, simply "reactant B"). Bis(tert-butylamino)silane (BTBAS) is one such principal reactant. In this example, the oxide deposition process involves delivery of an oxidant such as oxygen or nitrous oxide, which flows initially and continuously during delivery of the principal reactant in distinct exposure phases. The oxidant also continues to flow during distinct plasma exposure phases. See for example the sequence depicted in FIG. 1A.

In some specific examples, the reactant that flows continuously is an auxiliary reactant. The continuously flowing reactant may be provided at a constant flow rate or at varied but controlled flow rate. In the latter case, as an example, the flow rate of an auxiliary reactant may drop during an exposure phase when the primary reactant is delivered. For example, in oxide deposition, the oxidant (e.g., oxygen or nitrous oxide) may flow continuously during the entire deposition sequence, but its flow rate may drop when the primary reactant (e.g., BTBAS) is delivered. This increases the partial pressure of BTBAS during its dosing, thereby reducing the exposure time needed to saturate the substrate surface. Shortly before igniting the plasma, the flow of oxidant may be increased to reduce the likelihood that BTBAS is present during the plasma exposure phase. In some embodiments, the continuously flowing reactant flows at a varied flow rate over the course of two or more deposition cycles. For example, the reactant may flow at a first flow rate during a first CFD cycle and at a second flow rate during a second CFD cycle. In various embodiments, a first set of reaction cycles is performed under certain deposition conditions to deposit a first film, and a second set of reaction cycles is then performed under different conditions to deposit a second film on the first film. The two films may have different properties; for example, the second film having properties that are more electrically favorable for the desired application.

Where multiple auxiliary reactants are used, they can be mixed prior to delivery to the reaction chamber, or delivered as separate streams. In some embodiments, the auxiliary reactant is delivered continuously with an inert gas flow delivered in a burst for purge operations. In some embodiments, an inert gas flow may be continuous, with or without the inert gas flow rate increased for the purge operation. An optional purge can occur after the plasma is extinguished.

The concept of a CFD "sweep" or "purge" step or phase appears in the discussion various embodiments herein. Generally, a sweep phase removes or purges one of the vapor phase reactant from a reaction chamber and typically occurs only after delivery of such reactant is completed. In other words, that reactant is no longer delivered to the reaction chamber during the sweep phase. However, the reactant remains adsorbed on the substrate surface during the sweep phase. Typically, the sweep serves to remove any residual vapor phase reactant in the chamber after the reactant is adsorbed on the substrate surface to the desired level. A sweep phase may also remove weakly adsorbed species (e.g., certain precursor ligands or reaction by-products) from the substrate surface. In ALD, the sweep phase has been viewed as necessary to prevent gas phase interaction of two reactants or interaction of one reactant with a thermal, plasma or other driving force for the surface reaction. In general, and unless otherwise specified herein, a sweep/purge phase may be accomplished by (i) evacuating a reaction chamber, and/or (ii) flowing gas not containing the species to be swept out through the reaction chamber. In the case of (ii), such gas may be, for example, an inert gas or an auxiliary reactant such as a continuously flowing auxiliary reactant.

Different embodiments may implement sweep phases at different times. For example, in certain cases a sweep step may occur at any of the following times: (1) after delivery of a principal reactant, (2) between pulses of delivering a principal reactant, (3) after delivery of an auxiliary reactant, (4) before plasma exposure, (5) after plasma exposure, and (6) any combination of (1)-(5). Some of these timeframes may overlap. It has been shown that a first sweep performed after delivery of the principal reactant, and a second sweep performed after plasma excitation, are particularly useful in depositing uniform films.

Unlike many other deposition processes, particularly those requiring thermal activation, the CFD process may be conducted at a relatively low temperature. Generally, the CFD temperature will be between about 20 and 400 C. Such temperature may be chosen to permit deposition in the context of a temperature sensitive process such as deposition on a photoresist core. In a specific embodiment, a temperature of between about 20 and 100 C is used for double patterning applications (using, e.g., photoresist cores). In another embodiment, a temperature of between about 200 and 350 C is employed for memory fabrication processing. In some implementations, a first set of reaction cycles is performed at a first temperature, and a second set of reaction cycles is performed at a second temperature that is higher than the first temperature.

As suggested above, CFD is well suited for depositing films in advanced technology nodes. Thus, for example, CFD processing may be integrated in processes at the 32 nm node, the 22 nm node, the 16 nm node, the 11 nm node, and beyond any of these. These nodes are described in the International Technology Roadmap for Semiconductors (ITRS), the industry consensus on microelectronic technology requirements for many years. Generally they reference one-half pitch of a memory cell. In a specific example, the CFD processing is applied to "2X" devices (having device features in the realm of 20-29 nm) and beyond.

While most examples of CFD films presented herein concern silicon based microelectronic devices, the films may also find application in other areas. Microelectronics or optoelectronics using non-silicon semiconductors such as GaAs and other III-V semiconductors, as well as II-VI materials such as HgCdTe may profit from using the CFD processes disclosed herein. Applications for conformal dielectric films in the solar energy field, such as photovoltaic devices, in the electrochromics field, and other fields are possible.

Other example applications for CFD films include, but are not limited to conformal low-k films (e.g., k approximately 3.0 or lower in some non-limiting examples) for back-end-of-line interconnect isolation applications, conformal silicon nitride films for etch stop and spacer layer applications, conformal antireflective layers, and copper adhesion and barrier layers. Many different compositions of low-k dielectrics for BEOL processing can be fabricated using CFD. Examples include silicon oxides, oxygen doped carbides, carbon doped oxides, oxynitrides, and the like.

FIG. 1A schematically shows a timing diagram 100 for an example embodiment of a plasma-activated CFD process. Two full CFD cycles are depicted. As shown, each includes an exposure to reactant A phase 120, directly followed by an exposure to reactant B phase 140, a sweep of reactant B phase 160, and finally a plasma activation phase 180. Plasma energy provided during plasma activation phases 180A and 180B activates a reaction between surface adsorbed reactant species A and B. In the depicted embodiments, no sweep phase is performed after one reactant (reactant A) is delivered. In fact, this reactant flows continuously during the film deposition process. Thus, plasma is ignited while reactant A is in the gas phase. In the depicted embodiment, reactant gases A and B may co-exist in the gas phase without reacting. Accordingly, one or more of the process steps described in the ALD process may be shortened or eliminated in this example CFD process. For example, sweep steps after A Exposure Phases 120A and 120B may be eliminated.

FIG. 1A also shows an embodiment of a temporal progression of an example CFD process phases for various CFD process parameters. FIG. 1A depicts two example deposition cycles 110A and 110B, though it will be appreciated that any suitable number of deposition cycles may be included in a CFD process to deposit a desired film thickness. Example CFD process parameters include, but are not limited to, flow rates for inert and reactant species, plasma power and frequency, substrate temperature, and process station pressure.

A CFD cycle typically contains an exposure phase for each reactant. During this "exposure phase," a reactant is delivered to a process chamber to cause adsorption of the reactant on the substrate surface. Typically, at the beginning of an exposure phase, the substrate surface does not have any appreciable amount of the reactant adsorbed. In FIG. 1A, at reactant A exposure phases 120A and B, reactant A is supplied at a controlled flow rate to a process station to saturate exposed surfaces of a substrate. Reactant A may be any suitable deposition reactant; e.g., a principal reactant or an auxiliary reactant. In one example where CFD produces a silicon dioxide film, reactant A may be oxygen.

In the embodiment shown in FIG. 1A, reactant A flows continuously throughout deposition cycles 110A and 110B. Unlike a typical ALD process, where film precursor exposures are separated to prevent gas phase reaction, reactants A and B are allowed to mingle in the gas phase of some embodiments of a CFD process. As indicated above, in some embodiments reactants A and B are chosen so that they can co-existence in the gas phase without appreciably reacting with one another under conditions encountered in the reactor prior to application of plasma energy or the activation of the surface reaction. In some cases, the reactants are chosen such that (1) a reaction between them is thermodynamically favorable (i.e., Gibb's free energy <0) and (2) the reaction has a sufficiently high activation energy that there is negligible reaction at the desired deposition temperature absent plasma excitation.

Continuously supplying reactant A to the process station may reduce or eliminate a reactant A flow rate turn-on and stabilization time compared to an ALD process where reactant A is first turned on, then stabilized and exposed to the substrate, then turned off, and finally removed from a reactor. While the embodiment shown in FIG. 1A depicts reactant A exposure phases 120A and B as having a constant flow rate, it will be appreciated that any suitable flow of reactant A, including a variable flow, may be employed within the scope of the present disclosure. Further, while FIG. 1A shows reactant A having a constant flow rate during the entire CFD cycle (deposition cycle 110A), this need not be the case. For example, the flow rate of reactant A may decrease during B exposure phases 140A and 140B. This may increase the partial pressure of B and thereby increase the driving force of reactant B adsorbing on the substrate surface. In other cases, reactants A and B may each be delivered in doses (i.e., neither reactant flows continuously).

In some embodiments, reactant A exposure phase 120A may have a duration that exceeds a substrate surface saturation time for reactant A. For example, the embodiment of FIG. 1A includes a reactant A post-saturation exposure time 130 in reactant A exposure phase 120A. Optionally, reactant A exposure phase 120A includes a controlled flow rate of an inert gas. Example inert gases include, but are not limited to, nitrogen, argon, and helium. The inert gas may be provided to assist with pressure and/or temperature control of the process station, evaporation of a liquid precursor, more rapid delivery of the precursor and/or as a sweep gas for removing process gases from the process station and/or process station plumbing.

At Reactant B exposure phase 140A of the embodiment shown in FIG. 1A, reactant B is supplied at a controlled flow rate to the process station to saturate the exposed substrate surface. In one example silicon dioxide film, reactant B may be BTBAS. While the embodiment of FIG. 1A depicts reactant B exposure phase 140A as having a constant flow rate, it will be appreciated that any suitable flow of reactant B, including a variable flow, may be employed within the scope of the present disclosure. Further, it will be appreciated that reactant B exposure phase 140A may have any suitable duration. In some embodiments, reactant B exposure phase 140A may have a duration exceeding a substrate surface saturation time for reactant B. For example, the embodiment shown in FIG. 1A depicts a reactant B post-saturation exposure time 150 included in reactant B exposure phase 140A. Optionally, reactant B exposure phase 140A may include a controlled flow of a suitable inert gas, which, as described above, may assist with pressure and/or temperature control of the process station, evaporation of a liquid precursor, more rapid delivery of the precursor and may prevent back-diffusion of process station gases.

While the CFD process embodiment depicted in FIG. 1A is plasma activated, it will be appreciated that other non-thermal energy sources may be used within the scope of the present disclosure. Non-limiting examples of non-thermal energy sources include, but are not limited to, ultraviolet lamps, downstream or remote plasma sources, capacitively coupled plasmas, inductively-coupled plasmas, and microwave surface wave plasmas.

In some scenarios, surface adsorbed B species may exist as discontinuous islands on the substrate surface, making it difficult to achieve surface saturation of reactant B. Various surface conditions may delay nucleation and saturation of reactant B on the substrate surface. For example, ligands released on adsorption of reactants A and/or B may block some surface active sites, preventing further adsorption of reactant B. Accordingly, in some embodiments, continuous adlayers of reactant B may be provided by modulating a flow of and/or discretely pulsing reactant B into the process station during reactant B exposure phase 140A. This may provide extra time for surface adsorption and desorption processes while conserving reactant B compared to a constant flow scenario.

Figure 1B:
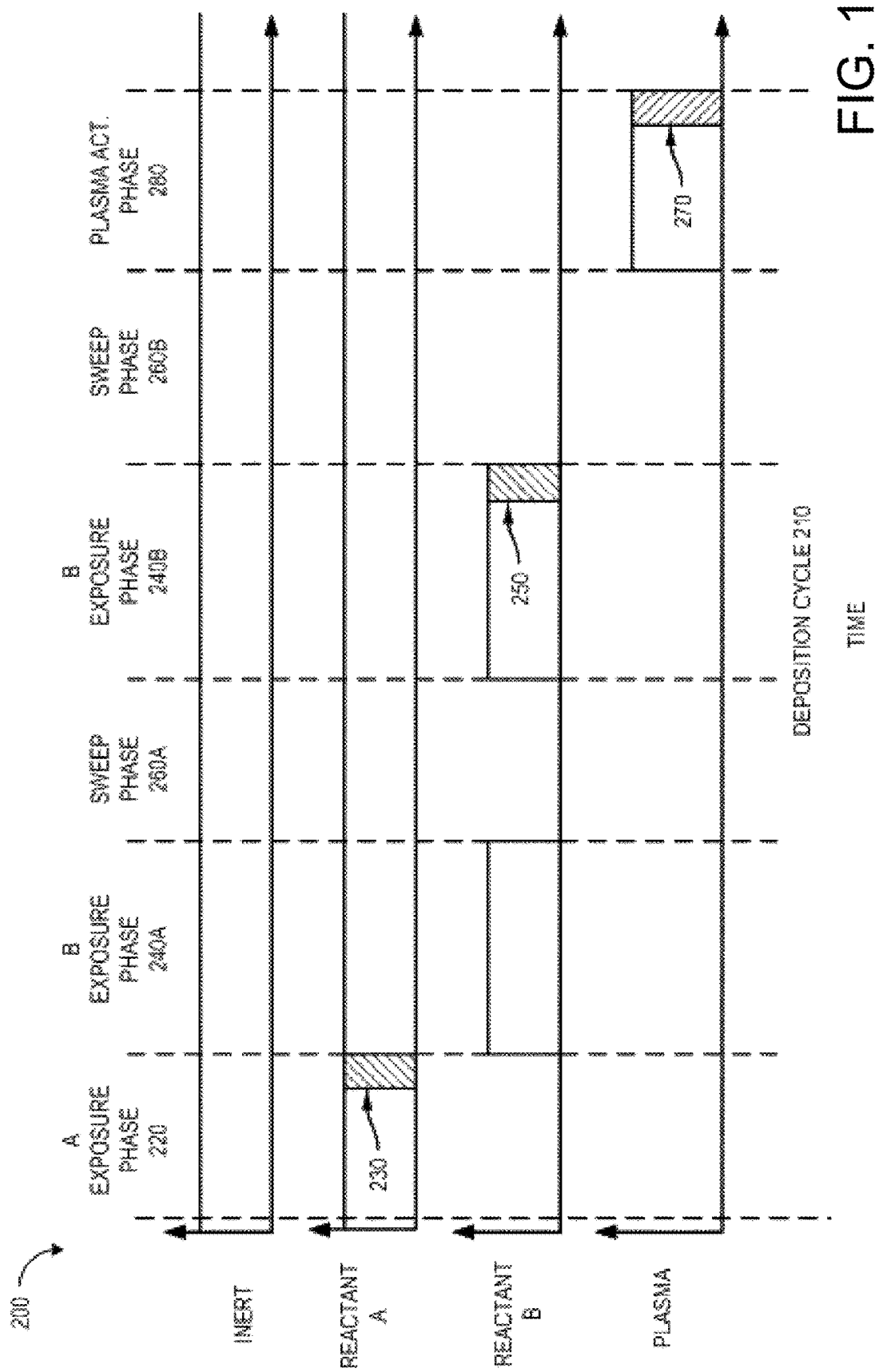

Additionally or alternatively, in some embodiments, one or more sweep phases may be included between consecutive exposures of reactant B. For example, the embodiment of FIG. 1B schematically shows an example CFD process timing diagram 200 for a deposition cycle 210. At reactant B exposure phase 240A, reactant B is exposed to the substrate surface. Subsequently, at sweep phase 260A, reactant B is turned off, and gas phase species of reactant B are removed from the process station. In one scenario, gas phase reactant B may be displaced by a continuous flow of reactant A and/or the inert gas. In another scenario, gas phase reactant B may be removed by evacuating the process station. Removal of gas phase reactant B may shift an adsorption/desorption process equilibrium, desorbing ligands, promoting surface rearrangement of adsorbed B to merge discontinuous islands of adsorbed B. At reactant B exposure phase 240B, reactant B is again exposed to the substrate surface. While the embodiment shown in FIG. 1B includes one instance of a reactant B sweep and exposure cycle, it will be appreciated that any suitable number of iterations of alternating sweep and exposure cycles may be employed within the scope of the present disclosure.

Returning to the embodiment of FIG. 1A, prior to activation by the plasma at 180A, gas phase reactant B may be removed from the process station in sweep phase 160A in some embodiments. A CFD cycle may include one or more sweep phases in addition to the above-described exposure phases. Sweeping the process station may avoid gas phase reactions where reactant B is susceptible to plasma activation. Further, sweeping the process station may remove surface adsorbed ligands that may otherwise remain and contaminate the film. Examples sweep gases include, but are not limited to, argon, helium, and nitrogen. In the embodiment shown in FIG. 1A, sweep gas for sweep phase 160A is supplied by the inert gas stream. In some embodiments, sweep phase 160A may include one or more evacuation subphases for evacuating the process station. Alternatively, it will be appreciated that sweep phase 160A may be omitted in some embodiments.

Sweep phase 160A may have any suitable duration. In some embodiments, increasing a flow rate of a one or more sweep gases may decrease the duration of sweep phase 160A. For example, a sweep gas flow rate may be adjusted according to various reactant thermodynamic characteristics and/or geometric characteristics of the process station and/or process station plumbing for modifying the duration of sweep phase 160A. In one non-limiting example, the duration of a sweep phase may be optimized by adjustment of the sweep gas flow rate. This may reduce deposition cycle time, which may improve substrate throughput.

A CFD cycle typically includes an "activation phase" in addition to the exposure and optional sweep phases described above. The activation phase serves to drive the reaction of the one or more reactants adsorbed on the substrate surface. At plasma activation phase 180A of the embodiment shown in FIG. 1A, plasma energy is provided to activate surface reactions between surface adsorbed reactants A and B. For example, the plasma may directly or indirectly activate gas phase molecules of reactant A to form reactant A radicals. These radicals may then interact with surface adsorbed reactant B, resulting in film-forming surface reactions. Plasma activation phase 180A concludes deposition cycle 110A, which in the embodiment of FIG. 1A is followed by deposition cycle 110B, commencing with reactant A exposure phase 120B.

In some embodiments, the plasma ignited in plasma activation phase 180A may be formed directly above the substrate surface. This may provide a greater plasma density and enhanced surface reaction rate between reactants A and B. For example, plasmas for CFD processes may be generated by applying a radio frequency (RF) field to a low-pressure gas using two capacitively coupled plates. In alternative embodiments, a remotely generated plasma may be generated outside of the main reaction chamber.

Any suitable gas may be used to form the plasma. In a first example, and inert gas such as argon or helium may be used to form the plasma. In a second example, a reactant gas such as oxygen or ammonia may be used to form the plasma. In a third example, a sweep gas such as nitrogen may be used to form the plasma. Of course, combinations of these categories of gases may be employed. Ionization of the gas between the plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for CFD processes may be formed by one or more suitable methods other than capacitive coupling of an RF field to a gas.

Plasma activation phase 180A may have any suitable duration. In some embodiments, plasma activation phase 180A may have a duration that exceeds a time for plasma-activated radicals to interact with all exposed substrate surfaces and adsorbates, forming a continuous film atop the substrate surface. For example, the embodiment shown in FIG. 1A includes a plasma post-saturation exposure time 190 in plasma activation phase 180A.

In one scenario, a CFD process may deposit a conformal silicon dioxide film on a non-planar substrate. For example, a CFD silicon dioxide film may be used for gap fill of structures, such as a trench fill of shallow trench isolation (STI) structures. While the various embodiments described below relate to a gap fill application, it will be appreciated that this is merely a non-limiting, illustrative application, and that other suitable applications, utilizing other suitable film materials, may be within the scope of the present disclosure. Other applications for CFD silicon dioxide films include, but are not limited to, interlayer dielectric (ILD) applications, intermetal dielectric (IMD) applications, premetal dielectric (PMD) applications, dielectric liners for through-silicon via (TSV) applications, resistive RAM (Re-RAM) applications, and/or stacked capacitor fabrication in DRAM applications.

Doped silicon oxide may be used as a diffusion source for boron, phosphorus, or even arsenic dopants. For example, a boron doped silicate glass (BSG), a phosphorus doped silicate glass (PSG), or even a boron phosphorus doped silicate glass (BPSG) could be used. Doped CFD layers can be employed to provide conformal doping in, for example, three-dimensional transistor structures such as multi-gate FinFET's and three-dimensional memory devices. Conventional ion implanters cannot easily dope sidewalls, especially in high aspect ratio structures.

CFD doped oxides as diffusion sources have various advantages. First, they provide high conformality at low temperature. In comparison, low-pressure CVD produced doped TEOS (tetraethylorthosilicate) is known but requires deposition at high temperature, and sub-atmospheric CVD and PECVD doped oxide films are possible at lower temperature but have inadequate conformality. Conformality of doping is important, but so is conformality of the film itself, since the film typically is a sacrificial application and will then need to be removed. A non-conformal film typically faces more challenges in removal, i.e. some areas can be overetched.

Additionally, CFD provides extremely well controlled doping concentration. As mentioned, a CFD process can provide from a few layers of undoped oxide followed by a single layer of doping. The level of doping can be tightly controlled by the frequency with which the doped layer is deposited and the conditions of the doping cycle. In certain embodiments, the doping cycle is controlled by for instance using a dopant source with significant steric hindrance. In addition to conventional silicon-based microelectronics, other applications of CFD doping include microelectronics and optoelectronics based on III-V semiconductors such as GaAs and II-VI semiconductors such as HgCdTe, photovoltaics, flat panel displays, and electrochromic technology.

In some embodiments, a plasma generator may be controlled to provide intermittent pulses of plasma energy during a plasma activation phase. For example, the plasma may be pulsed at one or more frequencies including, but not limited to, frequencies between 10 Hz and 500 Hz. This may enhance step coverage by reducing a directionality of ion bombardment in comparison to a continuous plasma. Further, this may reduce ion bombardment damage to the substrate. For example, photoresist substrates may be eroded by ion bombardment during a continuous plasma. Pulsing the plasma energy may reduce photoresist erosion.

Concurrent PECVD-type and CFD-type reactions may occur where reactant B co-exists with reactant A in a plasma environment. In some embodiments, co-existence of reactants in a plasma environment may result from a persistence of reactant B in a process station after a supply of reactant B has been discontinued, continuing an exposure of reactant B to the substrate. For example, FIG. 1C shows a timing diagram 2900 for an embodiment of a CFD process including a sweep phase having a positive time duration between discontinuing a supply of reactant B to the process station and plasma activation. As another example, FIG. 1D shows another timing diagram 3000 for an embodiment of a CFD process excluding a sweep phase (e.g., having a sweep time=0) between discontinuing a supply of reactant B and plasma activation.

In some embodiments, co-existence of reactants in a plasma environment may result from concurrent supply of reactant B to the process station and plasma activation. For example, FIG. 1E shows a timing diagram 3100 for an embodiment of a CFD process having an overlap (indicated by a "negative" sweep time) between a supply of reactant B to the process station and plasma activation.

While the various CFD deposition processes described above have been directed at depositing, treating, and/or etching single film types, it will be appreciated that some CFD processes within the scope of the present disclosure may include in-situ deposition of a plurality of film types. For example, alternating layers of film types may be deposited in-situ. In a first scenario, a double spacer for a gate device may be fabricated by in-situ deposition of a silicon nitride/silicon oxide spacer stack. This may reduce cycle time and increase process station throughput, and may avoid interlayer defects formed by potential film layer incompatibility. In a second scenario, an antireflective layer for lithographic patterning applications may be deposited as a stack of SiON or amorphous silicon and SiOC with tunable optical properties. In another scenario, a protective film layer is first deposited on a sensitive substrate (e.g., at the low damage conditions described herein), and then an electrically favorable film layer is deposited on the protective film layer. This bilayer approach may be used to prevent oxidation, nitridation, or other reaction on a sensitive substrate.

Many different reactants may be used in practicing the disclosed embodiments. Where the film deposited includes silicon, the silicon compound can be, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butyl silane, allylsilane, sec-butyl silane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$, bisdiethylaminosilane (BDEAS), diisopropylaminosilane (DIPAS), tridimethylaminotitanium (TDMAT), and the like. A further example of an aminosilane is trisilylamine ($N(SiH_3)_3$).

In other cases, the deposited film contains metal. Examples of metal-containing films that may be formed include oxides and nitrides of aluminum, titanium, hafnium, tantalum, tungsten, manganese, magnesium, strontium, etc., as well as elemental metal films. Example precursors may include metal alkylamines, metal alkoxides, metal alkylamides, metal halides, metal ß-diketonates, metal carbonyls, organometallics, etc. Appropriate metal-containing precursors will include the metal that is desired to be incorporated into the film. For example, a tantalum-containing layer may be deposited by reacting pentakis(dimethylamido)tantalum with ammonia or another reducing agent. Further examples of metal-containing precursors that may be employed include trimethylaluminum, tetraethoxytitanium, tetrakis-dimethyl-amido titanium, hafnium tetrakis(ethylmethylamide), bis(cyclopentadienyl)manganese, and bis(n-propylcyclopentadienyl)magnesium.

In some embodiments, the deposited film contains nitrogen, and a nitrogen-containing reactant must be used. A nitrogen-containing reactant contains at least one nitrogen, for example, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

In certain implementations, an oxygen-containing oxidizing reactant is used. Examples of oxygen-containing oxidizing reactants include oxygen, ozone, nitrous oxide, nitric oxide, nitrogen dioxide, carbon monoxide, carbon dioxide, sulfur monoxide, sulfur dioxide, oxygen-containing hydrocarbons ($C_xH_yO_z$), water ($H_2O$), mixtures thereof, etc.

In some embodiments, an optional pumpdown to less than about 1 Torr (e.g., using a setpoint of 0) may be employed after the plasma is extinguished, either before, during or after a post-plasma purge, if performed.

Figure 2:
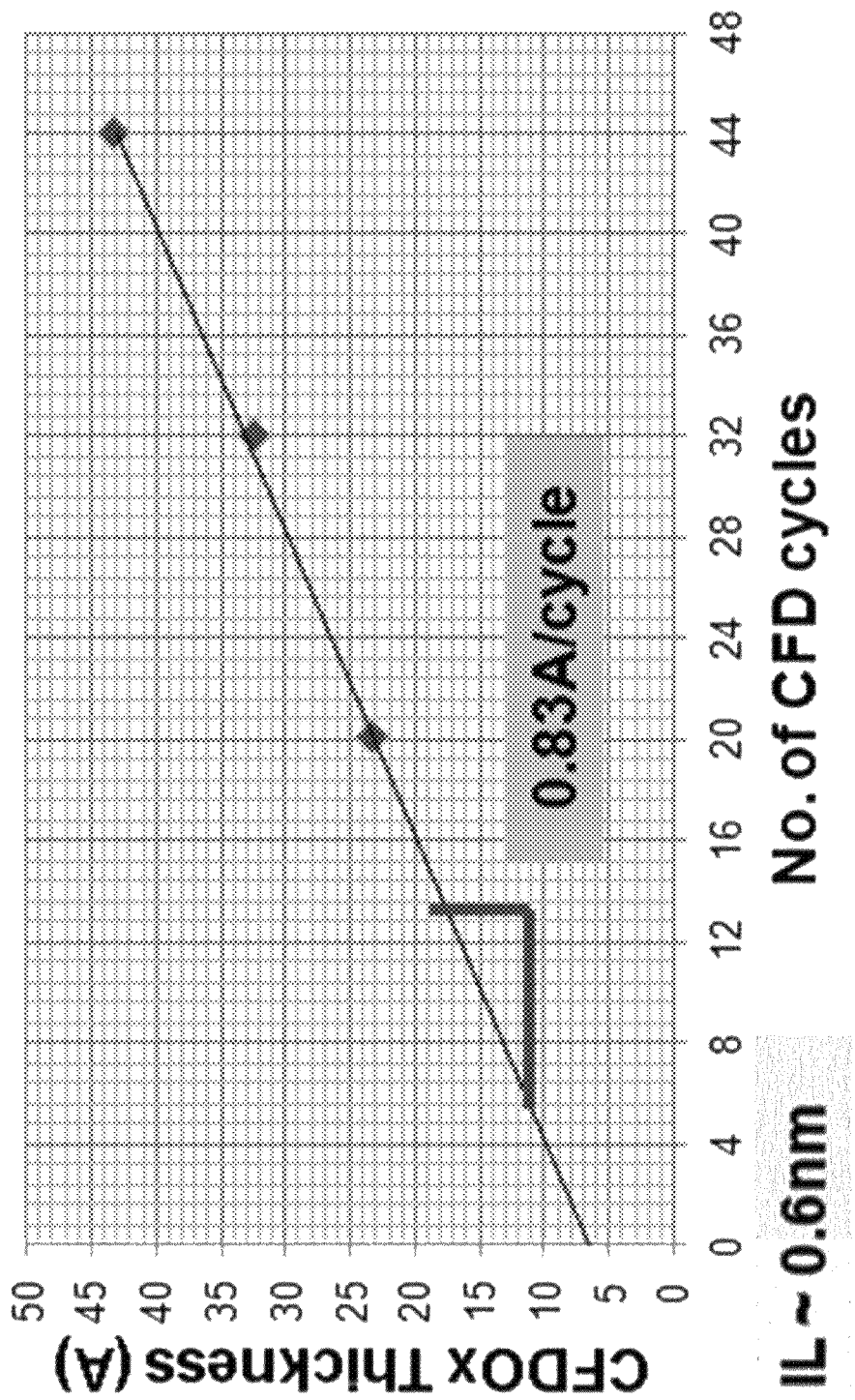
FIG. 2 shows experimental data illustrating oxidation damage to a substrate.

As mentioned above, conventional methods of depositing oxides can result in damage to the underlying substrate. FIG. 2 shows the existence of oxidation-related damage to the underlying substrate as occurs in a CFD method of depositing a silicon oxide layer at T=400° C. and RF Power=625 W/station using an $N_2/O_2$ oxidizer. By using a linear fit for film thickness (CFDOx Thickness) vs. number of CFD cycles, the y-intercept provides information regarding the native oxide thickness on the substrate surface. A y-intercept of zero would indicate that there was no oxidation of the underlying substrate during the deposition. As shown in FIG. 2, however, the method results in a native oxidation thickness of approximately 0.6 nm or 6 Å.

There are several critical factors which affect the amount of oxidation on sensitive substrates. Such factors include the temperature of the substrate during the deposition process, the power used to ignite the plasma, the choice of oxidation reactant, the chamber pressure, and the length of time that plasma power is applied during the deposition process. In various cases, a protective layer can be formed by maintaining the substrate between about 25° C. and 450° C. Generally, lower substrate temperatures will result in less oxidation of the substrate. In some embodiments, the protective layer can be formed by maintaining the substrate between about 25° C. and 200° C., for example between about 50° C. and 150° C. However, temperatures as high as 450° C. or even higher may be used in certain embodiments if other conditions such as plasma power are adjusted.

Figure 3A:
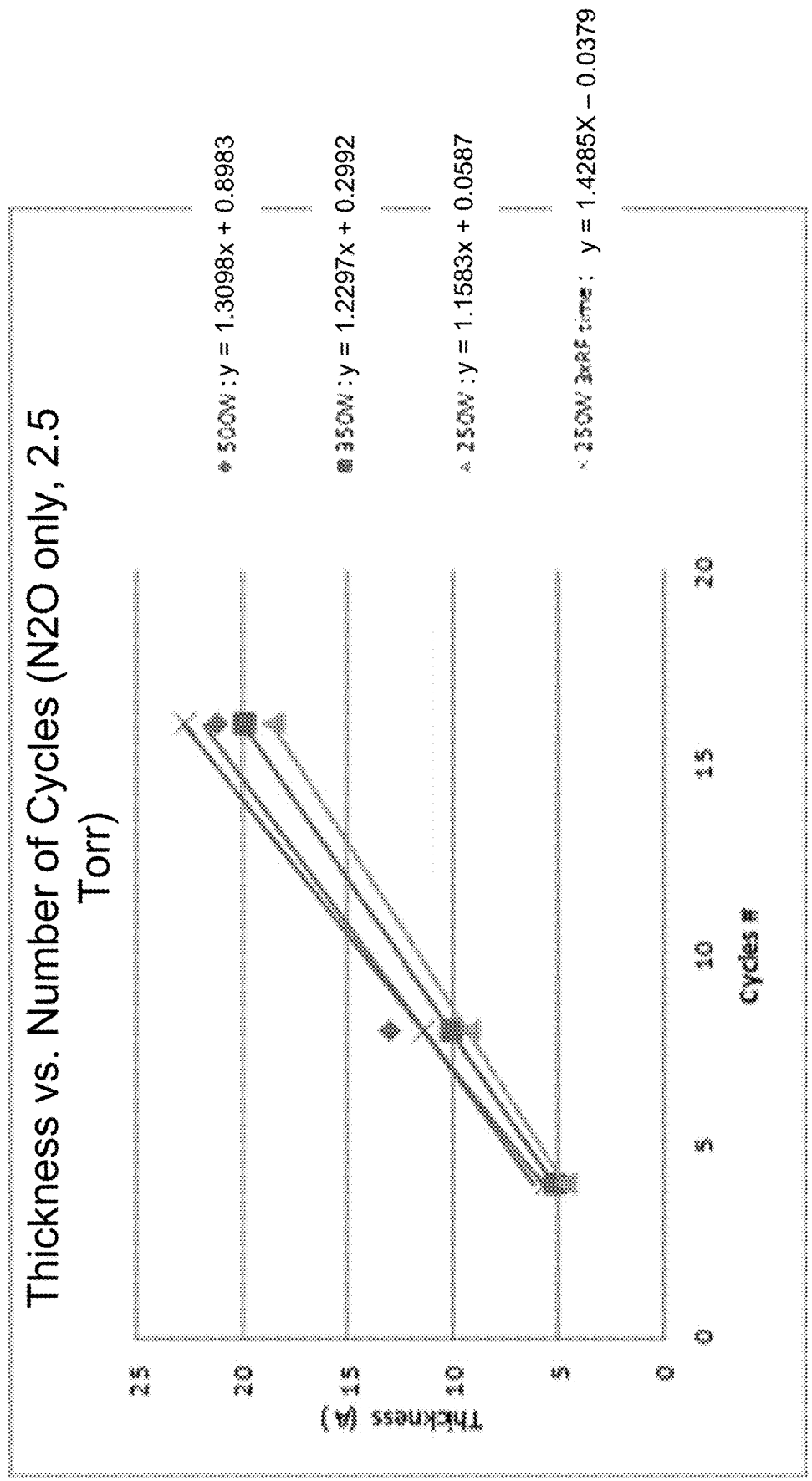
FIG. 3A shows film thickness vs. the number of deposition cycles for films deposited at different levels of radio frequency (RF) flux.
Figure 3B:
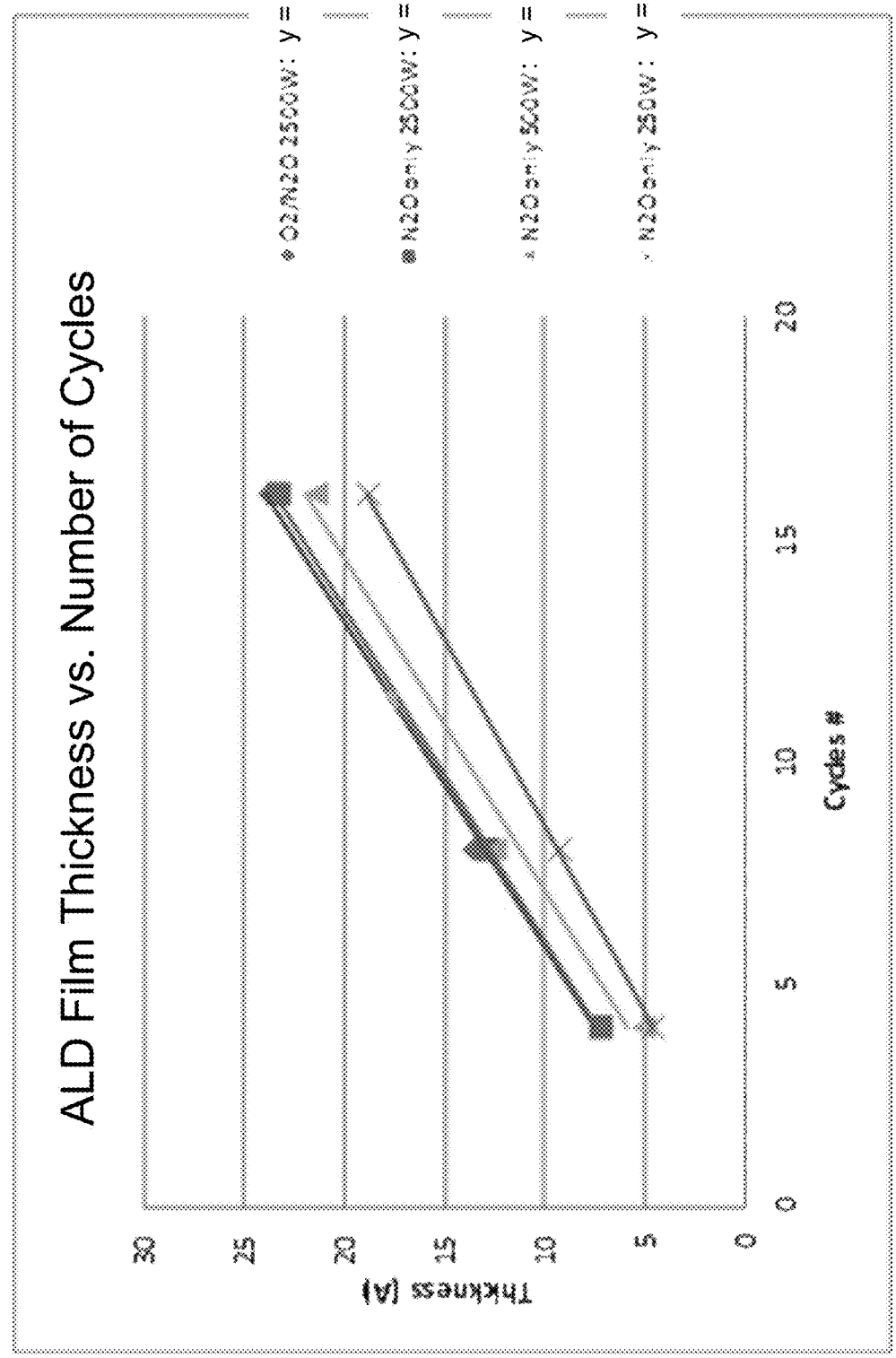
FIG. 3B shows the amount of substrate oxidation at different levels of RF flux and different ratios of $O_2$:weak oxidizer delivered during deposition.

Another critical factor affecting the level of substrate oxidation is the power used to ignite the plasma during the CFD process. Lower power results in less oxidation of the substrate. FIG. 3A shows the effect of RF power on the thickness of the oxidation of the substrate in a CFD deposition using $N_2O$ as the oxidant at 2.5 Torr. RF values compared here were 500 W (shown in diamonds), 350 W (shown in squares), 250 W (shown in triangles), and 250 W at 3xRF time (shown in X's). In FIG. 3A, as in FIG. 2, the y-intercept represents the amount of substrate oxidation. Thus, it can be seen that higher values of RF power have larger y-intercepts, and correspondingly higher levels of substrate oxidation. In FIGS. 3A and 3B (discussed further below) as well as in Table 1, below, the RF levels reported represent the total RF power used. This total power was divided between 4 RF stations. The RF power onset value for oxidation may be between about 60-90 W/station. An RF power value of 62.5 W/station exhibited almost no oxidation of the substrate. Accordingly, in certain embodiments, plasma-enhanced deposition may be performed at no more than about 60-90 W per station on an oxidation-sensitive substrate, below the RF power onset value for oxidation.

Table 1 below, which corresponds to the conditions and data shown in FIG. 3A, illustrates that the film stress may be modulated by varying the RF flux (i.e., RF power and/or RF time). At higher RF powers such as around 4 kW, the stress is about −200 to −250 MPa compressive. At the lower RF powers shown here, the stress becomes less compressive and closer to neutral. Table 1 also indicates that shorter RF times at equivalent RF power values also result in more neutral stress values. For example, where the RF power is 250 W, increasing the RF time by a factor of three raises the film stress by about a factor of three. Increasing the RF time also results in an increase in the breakdown voltage of the film (i.e., the BDV becomes more negative). This suggests that films formed at the low damage conditions may suffer from low breakdown voltages. However, this may not always be the case, evidenced by the fact that the film formed at 500 W showed a BDV lower (less negative) than the film formed at 250 W.

TABLE 1

Protective Layer ALD Film Properties with Different RF power and RF time

| Condition (N2O only, 2.5 T) | Thickness (A) | Non-uniformity (%) | Within-Wafer Thickness Range (A) | Stress (MPa) | Dep. Rate (A/cycle) | BDV (MV/cm) |
|---|---|---|---|---|---|---|
| 250 W | 1309 | 0.70 | 23 | −16 | 1.19 | −1.3 |
| 250 W at 3xRF time | 1552 | 0.17 | 14 | −45 | 1.41 | −1.7 |
| 500 W | 1454 | 0.17 | 15 | −46 | 1.32 | −1.2 |

All RF levels provided herein are for 300 mm wafers and may be scaled appropriately for wafers of different sizes. The RF power levels scale linearly with wafer area (conversion of RF power levels for wafers of other sizes may be done by maintaining the plasma density and distribution per unit area constant). For example, a reported value of 125 W/station may be scaled to approximately 280 W/station for a 450 mm diameter wafer.

In one embodiment, the RF power used to create the protective layer is between about 12.5 and 125 W/station. In another embodiment, the RF power used to create the protective layer is between about 50 and 125 W/station, or below about 100 W/station.

The amount of time over which the RF power is applied (RF time) can also affect the amount of substrate oxidation. Generally, longer RF times will result in more oxidation of the substrate. The duration of RF time during an plasma-enhanced ALD or CFD cycle may range from about 50 ms to about 1 s, for example about 0.25 s.

The RF levels described herein refer to high-frequency (HF) RF, though in certain embodiments, low frequency (LF) RF may be applied in addition to HF RF. Example high-frequency RF frequencies may include, but are not limited to, frequencies between about 1.8 MHz and 2.45 GHz. Example low-frequency RF frequencies may include, but are not limited to, frequencies between about 50 kHz and 500 kHz.

The choice of oxidation reactant can also affect the amount of substrate oxidation. The oxidation reactant is often a mixture of $O_2$ and a weak oxidizer. Examples of weak oxidizers include carbon oxides such as carbon dioxide ($CO_2$) and carbon monoxide (CO), nitrogen oxides such as nitrous oxide ($N_2O$), nitric oxide (NO) and nitrogen dioxide ($NO_2$), and sulfur oxides such as sulfur oxide (SO)

and sulfur dioxide ($SO_2$). Examples of other weak oxidizers include any oxygen containing hydrocarbons ($C_xH_yO_z$) and water ($H_2O$). Generally, lower relative amounts of $O_2$ and higher relative amounts of weak oxidizer result in less oxidation of the substrate. In some cases, the $O_2$ may be eliminated from the oxidation reactant altogether. In some embodiments, the oxidation reactant may include ozone in addition to or in place of a weak oxidizer. While ozone is generally a strong oxidizer, surface reactions such as those occurring during CFD may not be ion-driven, thus making ozone a potential candidate for the oxidation reactant, or an ingredient therein. Where ozone is used, surface damage to the substrate may be limited to the radical reaction enabled by the singlet state. Conversely, cracking of $O_2$ with plasma (e.g., a capacitively coupled or inductively coupled plasma) may impart ion related damage to the substrate due to the presence of $O^-$.

FIG. 3B demonstrates the effect of using two different oxidation reactants. The data are shown at two different levels of RF power. The amount of substrate oxidation decreases when the oxidation reactant is solely $N_2O$, as compared to when the oxidation reactant is a mixture of $N_2O$ and $O_2$.

In one embodiment for forming a protective film on a sensitive substrate, the oxidation reactant is between 0 and about 50% $O_2$, and between about 50 and 100% weak oxidizer. The oxidation reactant may be between 0 and 50% $O_2$, with the balance one or more weak oxidizers. The rate of oxidation reactant flow can range from about 1-25 SLM total. For example, the oxidation reactant may flow at about 20 SLM total, with about 10 SLM $O_2$ and about 10 SLM weak oxidizer such as $N_2O$. The oxidation reactant may be introduced coincident with the RF strike or may flow continuously.

In some embodiments, a silicon-containing reactant is used. This reactant may be introduced at a rate between about 0.25 mL/min and about 4 mL/min, and in some embodiments is introduced at a rate of about 0.5 mL/min.

Although much of the description in this document focuses on formation of silicon oxide films, the methods described herein may also be used to form other types of films on reaction-sensitive substrates. For example, the temperatures and RF power levels described above may be used to form SiN in a plasma-assisted reaction using a silicon precursor and a nitrogen-containing co-reactant. In this manner, unwanted nitridation of nitridation-sensitive substrates can be prevented. Moreover, the methods may also be used with deposition of non-silicon containing films including metal oxide and metal nitride films.

Another important factor affecting substrate oxidation is the pressure at which the CFD process occurs. Lower pressures may lead to less oxidation, making it preferable to run the CFD process at a low pressure while creating the protective layer. In one embodiment, the pressure may be between about 2 to 10 Torr, for example about 6 Torr.

The thickness of the protective layer is an important characteristic with respect to the performance of the resulting product. The processing conditions used to manufacture the protective layer may result in poor electrical qualities in the film. Thus, the protective layer should be thick enough to adequately prevent oxidation of the underlying substrate during subsequent processing and use, while being thin enough to achieve the overall desired electrical properties of the film. In one embodiment, the protective layer may range from about 10 to about 50 Å thick. While 50 Å may be sufficient to prevent subsequent oxidation during more aggressive process conditions, in some embodiments the protective layer may be thicker, for example less than about 100 Å, or in some cases even greater than 100 Å. In some embodiments, the protective layer may be the entire $SiO_2$ (or other material) layer.

In one aspect of the invention, the protective layer is incorporated into a bilayer. The protective layer forms the bottom layer, and an electrically favorable layer is deposited on top of the protective layer. Because the protective layer may have electrically unfavorable qualities such as low breakdown voltage (BDV) and high leakage current due to insufficient oxidative conversion, it is desirable to deposit the electrically favorable layer on top, thereby ensuring that the resulting product has the desired electrical qualities. The electrically favorable layer may be deposited at a higher substrate temperature, a higher RF power, a higher pressure, a longer RF time, and/or using a different oxidation (or other auxiliary) reactant than those used for producing the bottom protective layer.

In forming the electrically favorable layer, the substrate temperature is generally kept between about 50° C. and about 400° C. In some embodiments, the substrate is kept between about 150° C. and about 250° C., and in other embodiments the substrate is kept between about 300° C. and about 400° C. While in some embodiments the formation of each layer occurs at the same substrate temperature (i.e., the bilayer is created isothermally), in other embodiments the substrate temperature is higher during formation of the electrically favorable layer.

The RF power level used to create the electrically favorable layer may range from about 62.5 W/station to about 375 W/station, for example 250 W/station. The RF time may range from about 50 ms to about 1 s, and in one embodiment is about 0.25 s.

Like the oxidation reactant used to create the protective layer, the oxidation reactant used to create the electrically favorable layer is usually a mix of $O_2$ and weak oxidizer containing between 0 and about 50% $O_2$ and 50-100% weak oxidizer. In some embodiments, the ratio of $O_2$:weak oxidizer is higher during the deposition of the electrically favorable layer compared to the ratio used for deposition of the protective layer. In other embodiments, the same ratio of $O_2$:weak oxidizer is used for the deposition of each layer. The total flow of oxidation reactant may range from about 1-25 SLM, and in one embodiment is about 20 SLM with about 10 SLM $O_2$ and about 10 SLM weak oxidizer such as $N_2O$.

In some embodiments, a silicon-containing reactant is used to deposit the electrically favorable layer. This reactant may be introduced at a rate between about 0.25 mL/min and about 4 mL/min, and in some embodiments is introduced at a rate of about 0.5 mL/min.

The pressure used to create the electrically favorable layer may range from about 2 to about 10 Torr, for example about 6 Torr. In some embodiments, the protective layer and the electrically favorable layer are each deposited at the same pressure, while in other embodiments the electrically favorable layer is deposited at a relatively higher pressure to achieve the desired electrical qualities.

The thickness of the electrically favorable layer is governed by the application for which it will be used. For example, the layer may be between about 1 nm and about 25 nm for caps in logic technology, whereas the layer may be between about 5 Å-40 Å for interfacial layers in logic technology. Other thicknesses may be appropriate in different contexts.

Another characteristic that is important to the functionality of the resulting product is the relative thicknesses of the protective and electrically favorable layers. In some embodiments, the protective layer is between about 1% and about 20% of the total thickness of the bilayer. Some applications may require proportions which fall outside this range, for example less than 1% or greater than 20% of the total thickness.

Figure 4:
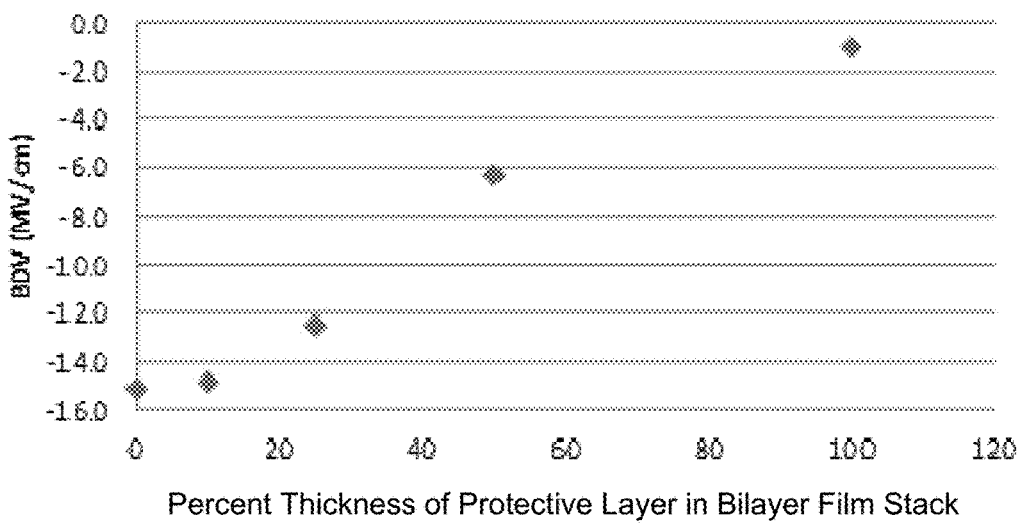
FIG. 4 shows data related to breakdown voltage vs. relative thickness of a protective layer.

FIG. 4 shows the breakdown voltage (BDV) for a range of relative thicknesses of the protective layer. All film thicknesses for this data set were 1000±50 Å. Data points that are further to the right on the x-axis in FIG. 4 represent bilayers having relatively thicker protective films and relatively thinner electrically favorable films. The process for forming the electrically favorable layer was run at T=150° C., HF Power=625 W/station, 3.5 T, using an $O_2/N_2O$ oxidizer reactant. The process for forming the protective layer was run at T=150° C., HF power=65 W/station, 2.5 T, using $N_2O$ as an oxidizer reactant. The BDV of the bilayer shows a strong dependence on the relative thickness of the protective layer in the bilayer, showing that the bilayer film stack's electrical properties are tunable. The data suggest that the BDV is still relatively good when the protective layer is around or less than about 20% of the total thickness of the bilayer.

Another aspect of the present invention is a method to evaluate substrate oxidation using a regular silicon substrate as the test vehicle, thereby avoiding the complexity of testing oxidation on device substrates. The method involves running the CFD process through many cycles and plotting the thickness of the layer vs. the number of cycles. By using a linear fit between the variables (thereby assuming that each CFD cycle deposits approximately the same thickness of film), the y-intercept can be extrapolated to provide the native oxide thickness on the substrate surface. A higher y-intercept implies more oxidation of the substrate, while a y-intercept of zero would imply that there was no oxidation of the substrate. An example of this method is described in relation to FIG. 2, above. When practicing this method, a number of film layers should be deposited before taking the first thickness measurement. This may help provide more accurate information regarding the damage to the substrate. In some implementations, at least about 5, or at least about 10 layers are deposited before the first thickness measurement is taken. After the substrate is coated during a nucleation phase of deposition, the substrate damage is expected to be minimal.

Another aspect of the invention relates to a method to determine the minimal thickness of the protective layer in the bilayer approach described above. This method will allow choice of a protective layer thickness that is sufficiently thick to protect the oxidation-sensitive substrate, while not being so thick as to detrimentally affect the desired electrical properties of the bilayer.

A series of protective film layers of different thicknesses can be deposited on individual substrates including, but not limited to, silicon wafers. For example, layers of different thicknesses ranging from about 0 Å to about 300 Å are deposited on individual substrates. The pre-plasma thickness of the layer on each substrate is measured. Next, the film layers are each exposed to 100 cycles of non-deposition plasma. For example, a substrate can be exposed to non-deposition cycles of a mixture of $O_2/N_2O$ plasma with RF power=2500 W (625 W/station), substrate temperature=150° C., and P=3.5 T. Next, the post-plasma thickness of each layer is measured. Δthickness is calculated as the difference between the pre-plasma thickness and the post-plasma thickness. The Δthickness is plotted against the pre-plasma thickness of the film layers. The minimal thickness used to protect the substrate from oxidation can be determined by finding the thickness at which the Δthickness is saturated (i.e., where the Δthickness levels out or becomes substantially stable). Substantially stable may mean when one additional layer of film results in a change in Δthickness of less than about 0.5 Å. At this point, the increase in thickness due to surface oxidation is prevented by the protective film and the Δthickness results purely from the contribution of film densification by plasma ion bombardment The above analysis assumes that Δthickness has two major contributors: (1) an increase in thickness due to substrate oxidation caused by O species penetrating through the protective layer, and (2) a decrease in thickness due to film densification by plasma ion bombardment. Because each wafer is processed with the same RF cycles, the film densification is assumed to be uniform across the different wafers.

Figure 5:
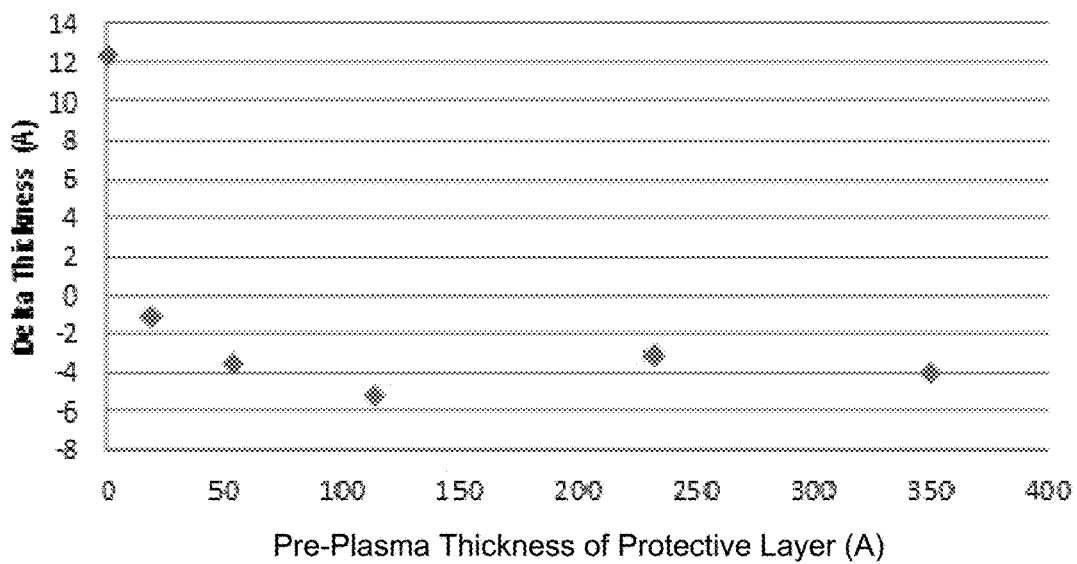
FIG. 5 shows data related to film densification, which may be used to determine the minimum thickness of a protective layer.

FIG. 5 shows a set of experimental data obtained using this method. As seen in FIG. 5, the data suggest that substrate oxidation was effectively prevented by a 50-100 Å thick protective layer. Furthermore, the data also suggest that the film densification caused by 100 cycles at the conditions described above resulted in a film densification of approximately 5 Å. Where other deposition conditions are used (e.g., different film types, underlying substrates, RF flux, temperature, pressure, etc.), the minimum thickness may be different. The disclosed method may be used to tailor a specific bilayer formation process to achieve the necessary electrical characteristics.

The numbers used in describing this method are given by way of example only, and are not intended to limit the scope of the invention. One of ordinary skill in the art would understand that a broad range of temperatures, RF powers, pressures and plasma compositions may be used.

Apparatus

Figure 6:
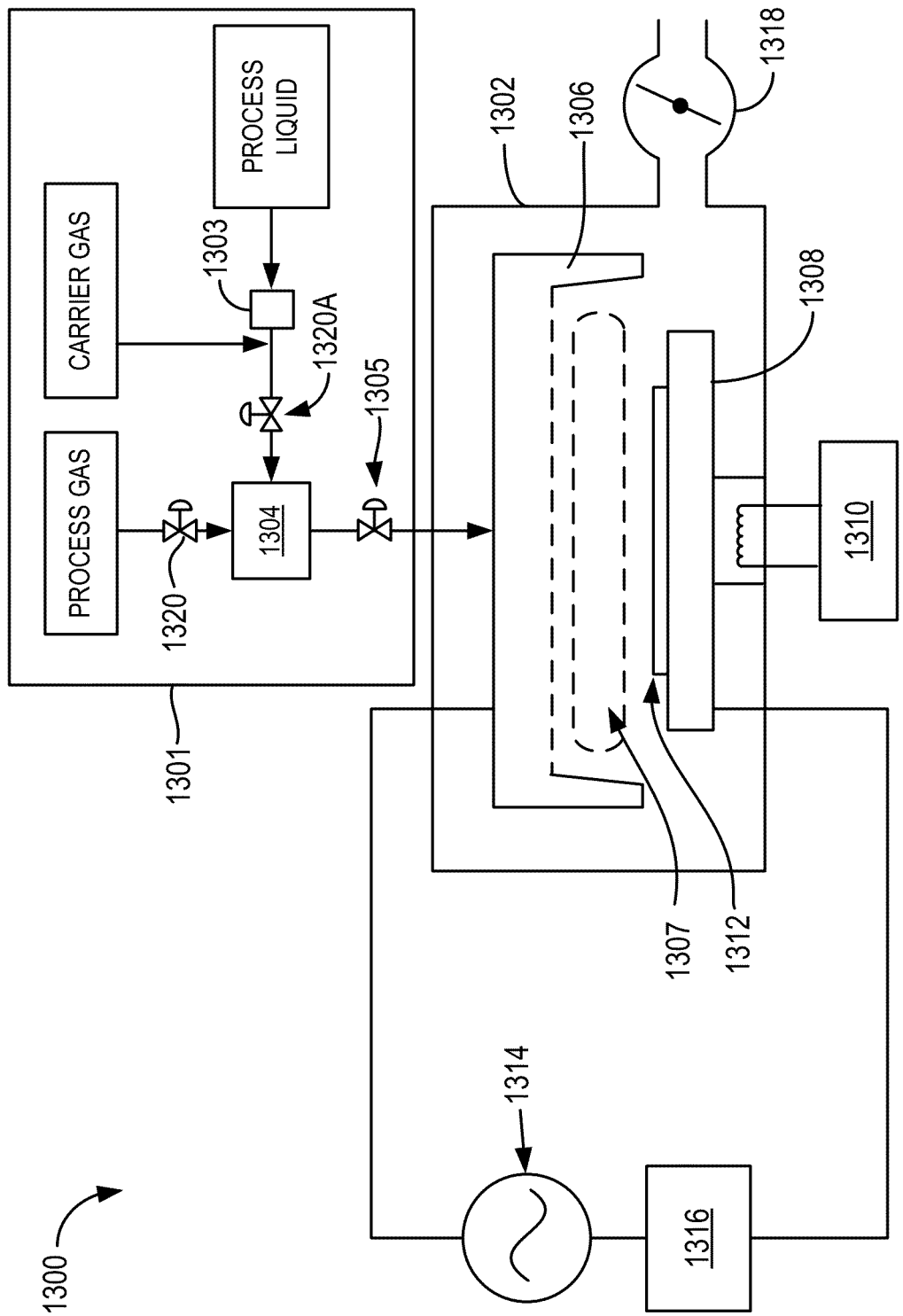
FIG. 6 illustrates a reaction chamber for performing atomic layer deposition according to certain disclosed embodiments.
Figure 7:
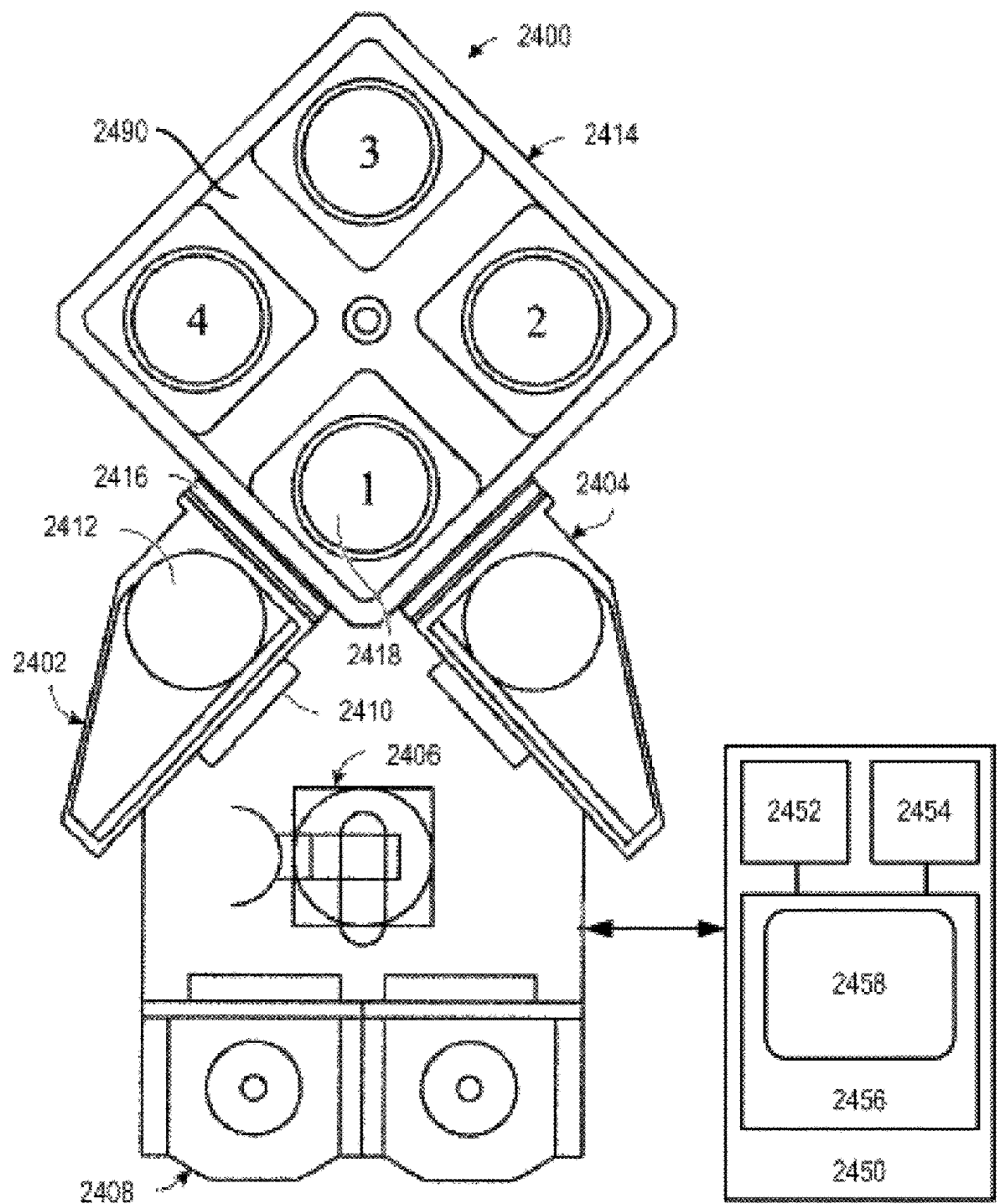
FIG. 7 illustrates a multi-tool apparatus that may be used to deposit films according to certain disclosed embodiments.

It will be appreciated that any suitable process station may be employed with one or more of the embodiments described above. For example, FIG. 6 schematically shows an embodiment of a CFD process station 1300. For simplicity, CFD process station 1300 is depicted as a standalone process station having a process chamber body 1302 for maintaining a low-pressure environment. However, it will be appreciated that a plurality of CFD process stations 1300 may be included in a common process tool environment. For example, FIG. 7 depicts an embodiment of a multi-station processing tool 2400. Further, it will be appreciated that, in some embodiments, one or more hardware parameters of CFD process station 1300, including those discussed in detail above, may be adjusted programmatically by one or more computer controllers.

CFD process station 1300 fluidly communicates with reactant delivery system 1301 for delivering process gases to a distribution showerhead 1306. Reactant delivery system 1301 includes a mixing vessel 1304 for blending and/or conditioning process gases for delivery to showerhead 1306. One or more mixing vessel inlet valves 1320 may control introduction of process gases to mixing vessel 1304.

Some reactants, like BTBAS, may be stored in liquid form prior to vaporization at and subsequent delivery to the process station. For example, the embodiment of FIG. 6 includes a vaporization point 1303 for vaporizing liquid reactant to be supplied to mixing vessel 1304. In some embodiments, vaporization point 1303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 1303 may be heat traced. In some examples, mixing vessel 1304 may also be heat traced. In one non-limiting example, piping downstream of vaporization point 1303 has an increasing temperature profile extending from approximately 100 degrees Celsius to approximately 150 degrees Celsius at mixing vessel 1304.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 1303. In one scenario, a liquid injector may be mounted directly to mixing vessel 1304. In another scenario, a liquid injector may be mounted directly to showerhead 1306.

In some embodiments, a liquid flow controller upstream of vaporization point 1303 may be provided for controlling a mass flow of liquid for vaporization and delivery to process station 1300. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 1306 distributes process gases toward substrate 1312. In the embodiment shown in FIG. 6, substrate 1312 is located beneath showerhead 1306, and is shown resting on a pedestal 1308. It will be appreciated that showerhead 1306 may have any suitable shape, and may have any suitable number and arrangement of ports for distributing processes gases to substrate 1312.

In some embodiments, a microvolume 1307 is located beneath showerhead 1306. Performing a CFD process in a microvolume rather than in the entire volume of a process station may reduce reactant exposure and sweep times, may reduce times for altering CFD process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 1308 may be raised or lowered to expose substrate 1312 to microvolume 1307 and/or to vary a volume of microvolume 1307. For example, in a substrate transfer phase, pedestal 1308 may be lowered to allow substrate 1312 to be loaded onto pedestal 1308. During a CFD process phase, pedestal 1308 may be raised to position substrate 1312 within microvolume 1307. In some embodiments, microvolume 1307 may completely enclose substrate 1312 as well as a portion of pedestal 1308 to create a region of high flow impedance during a CFD process.

Optionally, pedestal 1308 may be lowered and/or raised during portions the CFD process to modulate process pressure, reactant concentration, etc., within microvolume 1307. In one scenario where process chamber body 1302 remains at a base pressure during the CFD process, lowering pedestal 1308 may allow microvolume 1307 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 1308 may allow a plasma density to be varied during plasma activation and/or treatment cycles included in the CFD process. At the conclusion of the CFD process phase, pedestal 1308 may be lowered during another substrate transfer phase to allow removal of substrate 1312 from pedestal 1308.

In some embodiments, the pedestal 1308 may be cooled to help prevent damage to a substrate during a deposition process. Other portions of the apparatus/hardware may also be cooled to help reduce damage to the substrate. For instance, a cooled showerhead and/or a cooled chamber may be used. Examples of chamber surfaces that may be cooled include a top plate, chamber body, ribs, filler plates, spindle, transfer arm, etc. The cooling may counteract a raise in temperature that may otherwise occur. One purpose of the cooling is to maintain the substrate at a lower temperature. The temperature of these cooled components may be in the range of about 25-300° C., or between about 35-100° C. The cooling may be accomplished by providing a cooling loop that circulates liquid from a chiller, for example. Other cooling methods may also be used, and are generally known by those of ordinary skill in the art.

While the example microvolume variations described herein refer to a height-adjustable pedestal, it will be appreciated that, in some embodiments, a position of showerhead 1306 may be adjusted relative to pedestal 1308 to vary a volume of microvolume 1307. Further, it will be appreciated that a vertical position of pedestal 1308 and/or showerhead 1306 may be varied by any suitable mechanism within the scope of the present disclosure. In some embodiments, pedestal 1308 may include a rotational axis for rotating an orientation of substrate 1312. It will be appreciated that, in some embodiments, one or more of these example adjustments may be performed programmatically by one or more suitable computer controllers.

Returning to the embodiment shown in FIG. 6, showerhead 1306 and pedestal 1308 electrically communicate with RF power supply 1314 and matching network 1316 for powering a plasma. In some embodiments, the plasma energy may be controlled by controlling one or more of a process station pressure, a gas concentration, an RF source power, an RF source frequency, and a plasma power pulse timing. For example, RF power supply 1314 and matching network 1316 may be operated at any suitable power to form a plasma having a desired composition of radical species. Examples of suitable powers are included above. Likewise, RF power supply 1314 may provide RF power of any suitable frequency. In some embodiments, RF power supply 1314 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a CFD process recipe. In some cases, process recipe phases may be sequentially arranged, so that all instructions for a CFD process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In conventional deposition processes, plasma strikes last on the order of a few seconds or more in duration. In certain implementations described herein, much shorter plasma strikes may be applied during a CFD cycle. These may be on the order of 50 ms to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with CFD cycles.

In some embodiments, pedestal 1308 may be temperature controlled via heater 1310. Further, in some embodiments, pressure control for CFD process station 1300 may be provided by butterfly valve 1318. As shown in the embodiment of FIG. 6, butterfly valve 1318 throttles a vacuum provided by a downstream vacuum pump (not shown). However, in some embodiments, pressure control of process station 1300 may also be adjusted by varying a flow rate of one or more gases introduced to CFD process station 1300.

As described above, one or more process stations may be included in a multi-station processing tool. FIG. 7 shows a schematic view of an embodiment of a multi-station processing tool 2400 with an inbound load lock 2402 and an outbound load lock 2404, either or both of which may comprise a remote plasma source. A robot 2406, at atmospheric pressure, is configured to move wafers from a cassette loaded through a pod 2408 into inbound load lock 2402 via an atmospheric port 2410. A wafer is placed by the robot 2406 on a pedestal 2412 in the inbound load lock 2402, the atmospheric port 2410 is closed, and the load lock is pumped down. Where the inbound load lock 2402 comprises a remote plasma source, the wafer may be exposed to a remote plasma treatment in the load lock prior to being introduced into a processing chamber 2414. Further, the wafer also may be heated in the inbound load lock 2402 as well, for example, to remove moisture and adsorbed gases. Next, a chamber transport port 2416 to processing chamber 2414 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 2414 comprises four process stations, numbered from 1 to 4 in the embodiment shown in FIG. 7. Each station has a heated pedestal (shown at 2418 for station 1), and gas line inlets. It will be appreciated that in some embodiments, each process station may have different or multiple purposes. For example, in some embodiments, a process station may be switchable between a CFD and PECVD process mode. Additionally or alternatively, in some embodiments, processing chamber 2414 may include one or more matched pairs of CFD and PECVD process stations. While the depicted processing chamber 2414 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 also depicts an embodiment of a wafer handling system 2490 for transferring wafers within processing chamber 2414. In some embodiments, wafer handling system 2490 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 2450 employed to control process conditions and hardware states of process tool 2400. System controller 2450 may include one or more memory devices 2456, one or more mass storage devices 2454, and one or more processors 2452. Processor 2452 may include a CPU or computer, analog and/or digital input/output connections, stepper motor controller boards, etc.

In some embodiments, system controller 2450 controls all of the activities of process tool 2400. System controller 2450 executes system control software 2458 stored in mass storage device 2454, loaded into memory device 2456, and executed on processor 2452. System control software 2458 may include instructions for controlling the timing, mixture of gases, chamber and/or station pressure, chamber and/or station temperature, wafer temperature, target power levels, RF power levels, RF exposure time, substrate pedestal, chuck and/or susceptor position, and other parameters of a particular process performed by process tool 2400. System control software 2458 may be configured in any suitable way. For example, various process tool component subroutines or control objects may be written to control operation of the process tool components necessary to carry out various process tool processes. System control software 2458 may be coded in any suitable computer readable programming language.

In some embodiments, system control software 2458 may include input/output control (IOC) sequencing instructions for controlling the various parameters described above. For example, each phase of a CFD process may include one or more instructions for execution by system controller 2450. The instructions for setting process conditions for a CFD process phase may be included in a corresponding CFD recipe phase. In some embodiments, the CFD recipe phases may be sequentially arranged, so that all instructions for a CFD process phase are executed concurrently with that process phase.

Other computer software and/or programs stored on mass storage device 2454 and/or memory device 2456 associated with system controller 2450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 2418 and to control the spacing between the substrate and other parts of process tool 2400.

A process gas control program may include code for controlling gas composition and flow rates and optionally for flowing gas into one or more process stations prior to deposition in order to stabilize the pressure in the process station. In some embodiments, the controller includes instructions for depositing a protective layer at a first set of reactant conditions and instructions for depositing an electrically favorable layer at a second set of reactant conditions. The second set of reactant conditions may include a higher ratio of strong oxidizer:weak oxidizer.

A pressure control program may include code for controlling the pressure in the process station by regulating, for example, a throttle valve in the exhaust system of the process station, a gas flow into the process station, etc. In some embodiments, the controller includes instructions for depositing a protective layer at a first pressure, and depositing an electrically favorable layer over the protective layer at a second pressure, where the second pressure is higher than the first pressure.

A heater control program may include code for controlling the current to a heating unit that is used to heat the substrate. Alternatively, the heater control program may control delivery of a heat transfer gas (such as helium) to the substrate. In certain implementations, the controller includes instructions for depositing a protective layer at a first temperature, and an electrically favorable layer over the protective layer at a second temperature, where the second temperature is higher than the first temperature.

A plasma control program may include code for setting RF power levels and exposure times in one or more process stations in accordance with the embodiments herein. In some embodiments, the controller includes instructions for depositing a protective layer at a first RF power level and RF duration, and depositing an electrically favorable layer over the protective layer at a second RF power level and RF duration. The second RF power level and/or the second RF duration may be higher/longer than the first RF power level/duration.

In some embodiments, there may be a user interface associated with system controller 2450. The user interface may include a display screen, graphical software displays of the apparatus and/or process conditions, and user input devices such as pointing devices, keyboards, touch screens, microphones, etc.

In some embodiments, parameters adjusted by system controller 2450 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 2450 from various process tool sensors. The signals for controlling the process may be output on the analog and digital output connections of process tool 2400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 2450 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the present invention. Machine-readable, non-transitory media containing instructions for controlling process operations in accordance with the present invention may be coupled to the system controller.

What is claimed is:

1. A method of forming a silicon-containing bilayer on an exposed surface of a reaction-sensitive substrate, comprising:
   (a) forming a first layer of a silicon-containing film on the exposed surface by a first plasma-enhanced atomic layer deposition process, wherein the first plasma-enhanced atomic layer deposition process uses an oxidizing reactant comprising between about 50 and 100% weak oxidizer selected from the group consisting of CO, $CO_2$, NO, $NO_2$, $N_2O$, sulfoxides, oxygen-containing hydrocarbons ($C_xH_yO_z$), and $H_2O$, and between about 0 and 50% $O_2$; and
   (b) forming a second layer of the silicon-containing film on the first layer by a second plasma-enhanced atomic layer deposition process, wherein operation (b) is performed at a higher temperature than operation (a), wherein operation (b) uses a higher ratio of $O_2$:weak oxidizer than operation (a).

2. The method of claim 1, wherein the first layer of silicon-containing film is between about 1 and 20% of a total thickness of the bilayer.

3. The method of claim 1, wherein a thickness of the first layer of silicon-containing film is between about 10 and about 50 Angstroms.

4. The method of claim 1, wherein the exposed surface of the reaction-sensitive substrate is selected from the group consisting of silicon (Si), cobalt (Co), germanium-antimony-tellurium (GST), silicon-germanium (SiGe), silicon nitride (SiN), and silicon carbide (SiC).

5. The method of claim 1, wherein the silicon-containing film is a silicon oxide, a silicon nitride, a silicon carbide, a silicon oxynitride, a silicon oxycarbide, or a silicon nitrogen carbide film.

6. The method of claim 1, wherein a thickness of the first layer of silicon-containing film is determined by:
    (i) providing a plurality of individual substrates having differing thicknesses of silicon-containing protective films deposited thereon;
    (ii) measuring a pre-plasma thickness of each of the protective films on the individual substrates;
    (iii) after (ii), exposing the individual substrates to a plurality of plasma exposure cycles, wherein substantially no material is deposited during the plasma exposure;
    (iv) after (iii), measuring a post-plasma thickness of the protective films on the individual substrates;
    (v) calculating a thickness difference for each individual substrate, the thickness difference corresponding to the pre-plasma thickness minus the post-plasma thickness;
    (vi) determining the thickness of the first silicon-containing film by evaluating the protective film thickness at which the thickness difference becomes substantially stable.

7. The method of claim 1, wherein forming the first layer of the silicon-containing film by the first plasma-enhanced atomic layer deposition process in (a) comprises:
    (i) periodically exposing the reaction-sensitive substrate to a vapor phase flow of a silicon-containing reactant in a station of a reaction chamber;
    (ii) exposing the reaction-sensitive substrate to a vapor phase flow of an oxidizing reactant or nitrogen-containing reactant in the station of the reaction chamber; and
    (iii) periodically igniting a plasma in the reaction chamber when the vapor phase flow of the silicon-containing reactant has ceased to thereby form the first layer of the silicon-containing film, wherein the plasma forms between two electrodes, wherein the reaction-sensitive substrate is positioned between the two electrodes, and wherein a substrate temperature is maintained between about 5° C. and about 200° C. during (a).

8. The method of claim 7, wherein forming the second layer of the silicon-containing film by the second plasma-enhanced atomic layer deposition process in (b) comprises:
    (i) periodically exposing the reaction-sensitive substrate to a second vapor phase flow of a second silicon-containing reactant in the station of the reaction chamber;
    (ii) exposing the reaction-sensitive substrate to a second vapor phase flow of a second oxidizing reactant or a second vapor phase flow of a second nitrogen-containing reactant in the station of the reaction chamber; and
    (iii) periodically igniting the plasma in the reaction chamber when the vapor phase flow of the second silicon-containing reactant has ceased, wherein the plasma forms between two electrodes, and wherein the reaction-sensitive substrate is positioned between the two electrodes, and wherein a substrate temperature is maintained between about 300° C. and about 400° C. during (b).

9. A method of forming a silicon-containing bilayer on a reaction-sensitive substrate, comprising:
    (a) forming a first layer of a silicon-containing film on the substrate by a first plasma-enhanced atomic layer deposition process, wherein the first plasma-enhanced atomic layer deposition process uses an oxidizing reactant comprising between about 50 and 100% weak oxidizer selected from the group consisting of CO, $CO_2$, NO, $NO_2$, $N_2O$, sulfoxides, oxygen-containing hydrocarbons ($C_xH_yO_z$), and $H_2O$, and between about 0 and 50% $O_2$; and
    (b) forming a second layer of the silicon-containing film on the first layer by a second plasma-enhanced atomic layer deposition process, wherein operation (b) is performed using a higher radio frequency power than in operation (a), wherein operation (b) uses a higher ratio of $O_2$:weak oxidizer than operation (a).

10. The method of claim 9, wherein the first layer of silicon-containing film is between about 1 and 20% of a total thickness of the bilayer.

11. The method of claim 9, wherein a thickness of the first layer of silicon-containing film is between about 10 and about 50 Angstroms.

12. The method of claim 9, wherein the reaction-sensitive substrate comprises an exposed surface on which the first layer of a silicon-containing film is formed, the expose surface being selected from the group consisting of silicon (Si), cobalt (Co), germanium-antimony-tellurium (GST), silicon-germanium (SiGe), silicon nitride (SiN), and silicon carbide (SiC).

13. The method of claim 9, wherein the silicon-containing film is a silicon oxide, a silicon nitride, a silicon carbide, a silicon oxynitride, a silicon oxycarbide, or a silicon nitrogen carbide film.

14. The method of claim 9, wherein a thickness of the first layer of silicon-containing film is determined by:
    (i) providing a plurality of individual substrates having differing thicknesses of silicon-containing protective films deposited thereon;
    (ii) measuring a pre-plasma thickness of each of the protective films on the individual substrates;
    (iii) after (ii), exposing the individual substrates to a plurality of plasma exposure cycles, wherein substantially no material is deposited during the plasma exposure;
    (iv) after (iii), measuring a post-plasma thickness of the protective films on the individual substrates;
    (v) calculating a thickness difference for each individual substrate, the thickness difference corresponding to the pre-plasma thickness minus the post-plasma thickness;
    (vi) determining the thickness of the first silicon-containing film by evaluating the protective film thickness at which the thickness difference becomes substantially stable.

15. The method of claim 9, wherein forming the first layer of the silicon-containing film by the first plasma-enhanced atomic layer deposition process in (a) comprises:
    (i) periodically exposing the reaction-sensitive substrate to a vapor phase flow of a silicon-containing reactant in a station of a reaction chamber;

(ii) exposing the reaction-sensitive substrate to a vapor phase flow of an oxidizing reactant or nitrogen-containing reactant in the station of the reaction chamber; and (iii) periodically igniting a plasma in the reaction chamber using a high frequency radio frequency power between about 12.5 and about 125 Watts per station when the vapor phase flow of the silicon-containing reactant has ceased to thereby form the first layer of the silicon-containing film, wherein the plasma forms between two electrodes, and wherein the reaction-sensitive substrate is positioned between the two electrodes.

16. The method of claim 15, wherein forming the second layer of the silicon-containing film by the second plasma-enhanced atomic layer deposition process in (b) comprises:

(i) periodically exposing the reaction-sensitive substrate to a second vapor phase flow of a second silicon-containing reactant in the station of the reaction chamber;

(ii) exposing the reaction-sensitive substrate to a second vapor phase flow of a second oxidizing reactant or a second vapor phase flow of a second nitrogen-containing reactant in the station of the reaction chamber; and (iii) periodically igniting the plasma in the reaction chamber using a high frequency radio frequency power between about 250 and about 1500 Watts per station when the vapor phase flow of the second silicon-containing reactant has ceased.

* * * * *